(12) United States Patent
Jee et al.

(10) Patent No.: US 9,111,897 B2
(45) Date of Patent: Aug. 18, 2015

(54) METHODS OF FORMING A POLYSILICON LAYER AND METHODS OF MANUFACTURING SEMICONDUCTOR DEVICES

(71) Applicants: Jung-Geun Jee, Seoul (KR); Jin-Gyun Kim, Yongin-si (KR); Ji-Hoon Choi, Seongnam-si (KR); Ki-Hyun Hwang, Seongnam-si (KR)

(72) Inventors: Jung-Geun Jee, Seoul (KR); Jin-Gyun Kim, Yongin-si (KR); Ji-Hoon Choi, Seongnam-si (KR); Ki-Hyun Hwang, Seongnam-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 99 days.

(21) Appl. No.: 13/716,859

(22) Filed: Dec. 17, 2012

(65) Prior Publication Data

US 2013/0273704 A1 Oct. 17, 2013

(30) Foreign Application Priority Data

Apr. 13, 2012 (KR) ........................ 10-2012-0038398

(51) Int. Cl.
| | |
|---|---|
| *H01L 21/336* | (2006.01) |
| *H01L 21/36* | (2006.01) |
| *H01L 29/66* | (2006.01) |
| *H01L 21/02* | (2006.01) |
| *H01L 27/108* | (2006.01) |
| *H01L 27/115* | (2006.01) |
| *H01L 21/285* | (2006.01) |
| *H01L 21/768* | (2006.01) |
| *C23C 16/24* | (2006.01) |

(52) U.S. Cl.
CPC ................ *H01L 21/36* (2013.01); *C23C 16/24* (2013.01); *H01L 21/0245* (2013.01); *H01L 21/0262* (2013.01); *H01L 21/02381* (2013.01); *H01L 21/02488* (2013.01); *H01L 21/02494* (2013.01); *H01L 21/02532* (2013.01); *H01L 21/02576* (2013.01); *H01L 21/02579* (2013.01); *H01L 21/02595* (2013.01); *H01L 21/02639* (2013.01); *H01L 21/28525* (2013.01); *H01L 21/28556* (2013.01); *H01L 21/76876* (2013.01); *H01L 21/76877* (2013.01); *H01L 27/10888* (2013.01); *H01L 27/11582* (2013.01); *H01L 29/66666* (2013.01)

(58) Field of Classification Search
CPC .......................... H01L 21/36; H01L 29/66666
USPC .................................................. 438/270, 488
See application file for complete search history.

(56) References Cited

U.S. PATENT DOCUMENTS

| | | | |
|---|---|---|---|
| 7,651,955 B2 | 1/2010 | Ranish et al. | |
| 7,964,441 B2 | 6/2011 | Joe et al. | |
| 8,802,547 B2 * | 8/2014 | Kakimoto et al. | ............ 438/482 |
| 2005/0255246 A1 | 11/2005 | Kim et al. | |
| 2007/0251444 A1 | 11/2007 | Gros-Jean et al. | |

(Continued)

FOREIGN PATENT DOCUMENTS

| | | |
|---|---|---|
| KR | 1020030064083 | 7/2003 |
| KR | 1020110009739 | 1/2011 |

*Primary Examiner* — Jarrett Stark
*Assistant Examiner* — Mohammad M Hoque
(74) *Attorney, Agent, or Firm* — F. Chau & Associates, LLC

(57) ABSTRACT

A method of forming a polysilicon layer includes providing a silicon precursor onto an object loaded in a process chamber to form a seed layer. The silicon precursor includes a nitrogen containing silicon precursor and a chlorine containing silicon precursor. The method further includes providing a silicon source on the seed layer.

20 Claims, 25 Drawing Sheets

(56) References Cited

U.S. PATENT DOCUMENTS

| | | |
|---|---|---|
| 2009/0041952 A1 | 2/2009 | Yoon et al. |
| 2009/0130608 A1 | 5/2009 | Irving et al. |
| 2009/0269926 A1* | 10/2009 | Dube et al. .................... 438/680 |
| 2010/0159711 A1 | 6/2010 | Venkataraman et al. |
| 2010/0304047 A1 | 12/2010 | Yang et al. |
| 2011/0263105 A1* | 10/2011 | Hasebe et al. ................ 438/482 |
| 2011/0306195 A1* | 12/2011 | Kim et al. ..................... 438/591 |
| 2011/0312192 A1* | 12/2011 | Murakami et al. ............ 438/787 |
| 2012/0028450 A1* | 2/2012 | Son et al. ...................... 438/479 |
| 2012/0115293 A1* | 5/2012 | Noh et al. ..................... 438/239 |
| 2012/0164842 A1* | 6/2012 | Watanabe et al. ............. 438/763 |
| 2012/0178264 A1* | 7/2012 | Murakami et al. ............ 438/765 |
| 2013/0164907 A1* | 6/2013 | Lee ................................ 438/400 |
| 2013/0210241 A1* | 8/2013 | LaVoie et al. ................. 438/791 |

\* cited by examiner

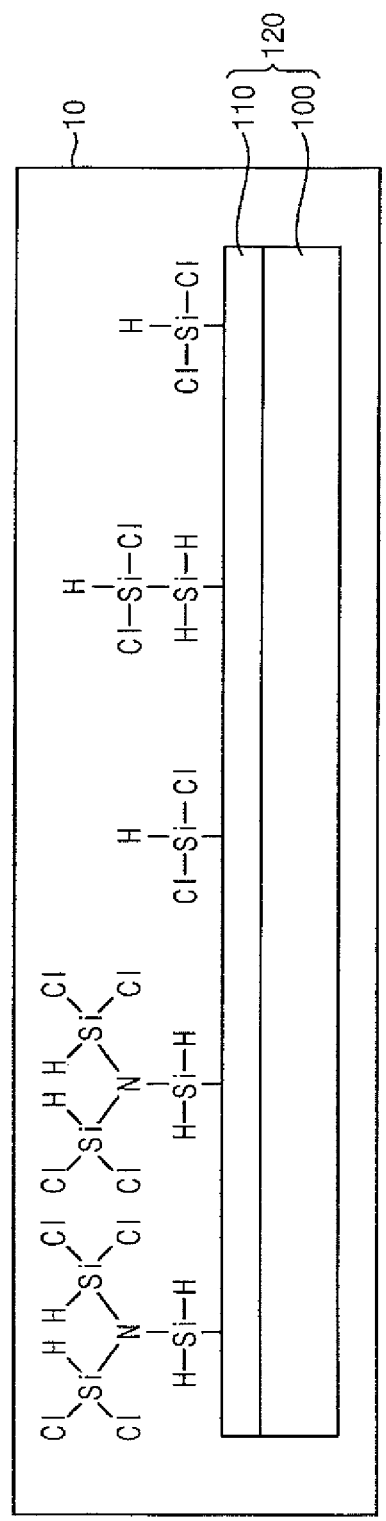

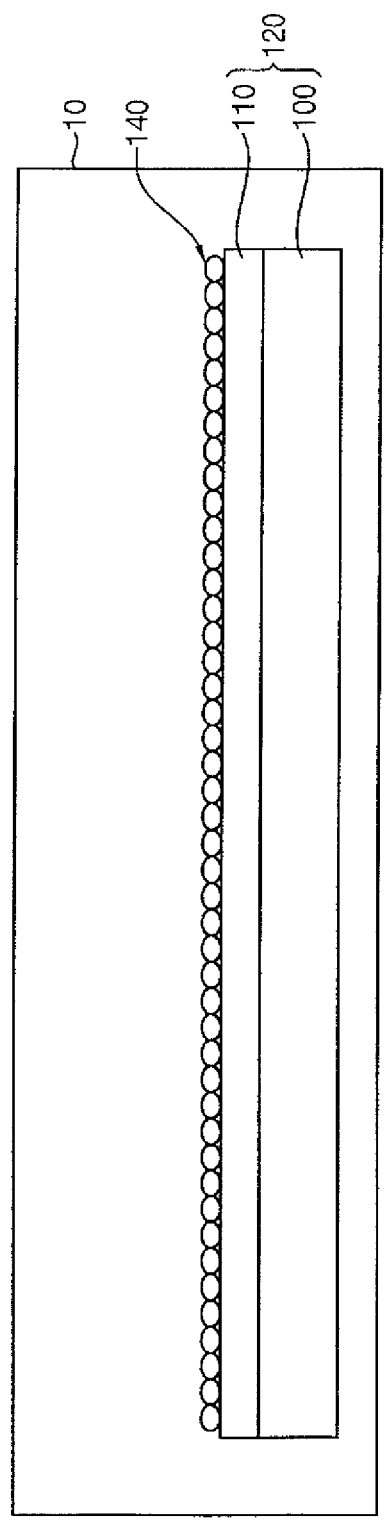

2ND DIRECTION
⊗ — 1ST DIRECTION

2ND DIRECTION
⊗ ⟶ 1ST DIRECTION

2ND DIRECTION
⊗ ⟶ 1ST DIRECTION

2ND DIRECTION
⊗⟶ 1ST DIRECTION

FIG. 29
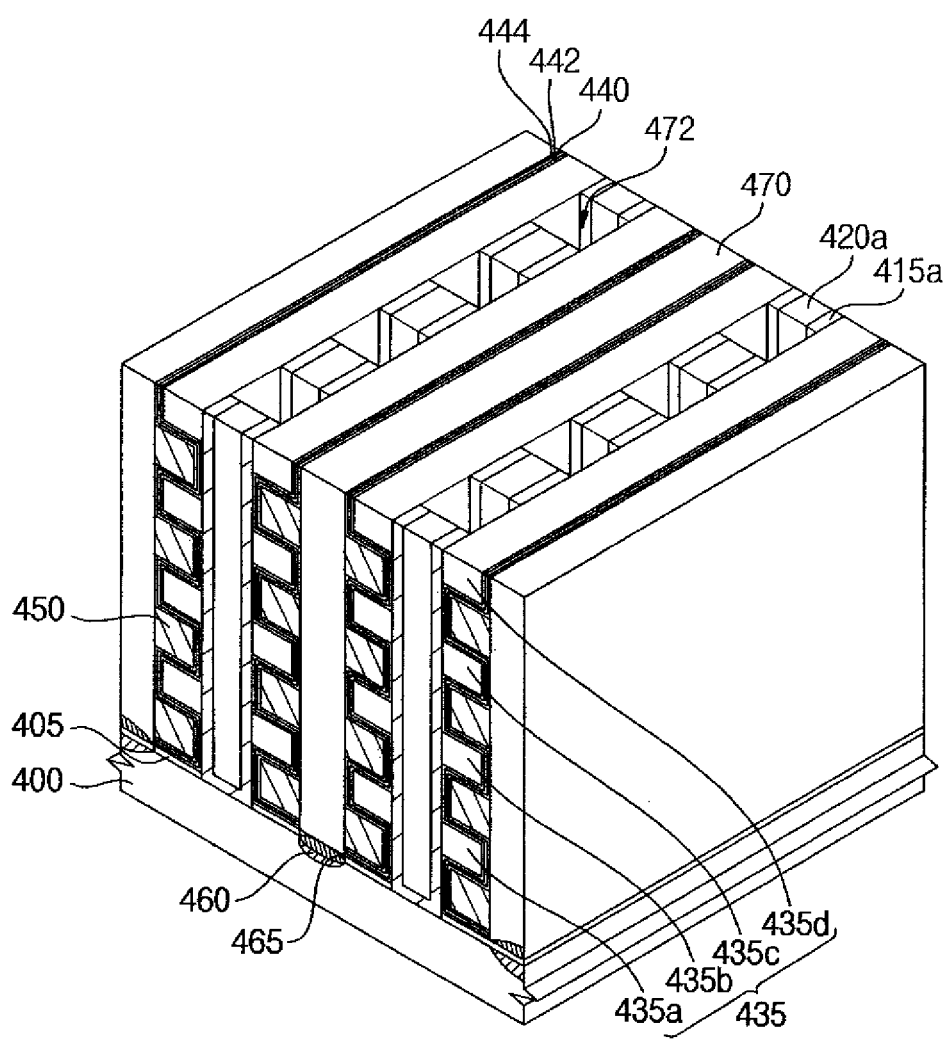
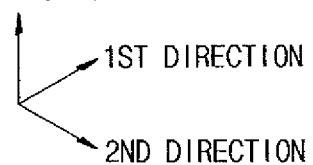

METHODS OF FORMING A POLYSILICON LAYER AND METHODS OF MANUFACTURING SEMICONDUCTOR DEVICES

CROSS-REFERENCE TO RELATED APPLICATIONS

This application claims priority under 35 USC §119 to Korean Patent Application No. 10-2012-0038398 filed on Apr. 13, 2012, the disclosure of which is hereby incorporated by reference herein in its entirety.

TECHNICAL FIELD

Example embodiments relate to methods of forming a polysilicon layer and methods of manufacturing semiconductor devices.

DISCUSSION OF THE RELATED ART

A polysilicon layer may be utilized in various semiconductor devices. For example, the polysilicon layer may be used as a vertical channel of a vertical memory device. The polysilicon layer may be formed by, for example, an atomic layer deposition (ALD) process because the ALD process may be beneficial for obtaining a uniformity or a step coverage of the polysilicon layer. However, when the polysilicon layer is formed within a structure having a high aspect ratio, e.g., a hole or a trench, the polysilicon layer having a uniform profile may not be easily obtained even by the ALD process.

SUMMARY

Example embodiments provide a method of forming a polysilicon layer having a uniform profile.

Example embodiments provide a method of manufacturing a semiconductor device including the polysilicon layer.

According to an example embodiment, there is provided a method of forming a polysilicon layer. In the method, a silicon precursor is provided onto an object loaded in a process chamber to form a seed layer. The silicon precursor includes a nitrogen containing silicon precursor and a chlorine containing silicon precursor. The method further includes providing a silicon source on the seed layer.

In an example embodiment, the nitrogen containing silicon precursor may include Bis(ethylmethylamino)silane (BEMAS), Bis(diethylamino)silane (BDEAS), Bis(dimethylamino)silane (BDMAS), tris(dimethylamino)silane (Tris-DMAS), tetrakis(dimethylamino)silane (TDMAS), tris(ethylmethylamino)silane (Tris-EMAS), Diethylaminosiliane (DEAS), Bis(tertybutylamino)silane (BTBAS) or Di-Isopropyl-Amino-Silane (DIPAS). These may be used alone or in a mixture thereof.

In an example embodiment, the chlorine containing silicon precursor may include dichlorosilane ($SiCl_2H_2$), trichlorosilane ($SiCl_3H$), tetrachlorosilane ($SiCl_4$) or hexachlorodisilane ($Si_2Cl_6$). These may be used alone or in a mixture thereof.

In an example embodiment, the silicon source may include silane ($SiH_4$), disilane ($Si_2H_6$) or trisilane ($Si_3H_8$). These may be used alone or in a mixture thereof.

In an example embodiment, the process chamber may include an atomic layer deposition (ALD) process chamber.

In an example embodiment, the providing of the silicon precursor onto the object loaded in the process chamber to form the seed layer includes providing the nitrogen containing silicon precursor onto the object loaded in the process chamber to form a preliminary seed layer and providing the chlorine containing silicon precursor on the preliminary seed layer to form the seed layer.

In an example embodiment, a first purge process and a heat treatment may be further performed after forming the preliminary seed layer.

In an example embodiment, nitrogen atoms or silicon atoms of the nitrogen containing silicon precursor may be activated by the first purge process and the heat treatment.

In an example embodiment, a second purge process may be further performed after providing the chlorine containing silicon precursor.

In an example embodiment, the seed layer may have a single atomic layer structure.

In an example embodiment, the nitrogen containing silicon precursor and the chlorine containing silicon precursor may be simultaneously provided.

In an example embodiment, forming the preliminary seed layer and forming the seed layer are repeatedly performed.

In an example embodiment, the object may include a substrate and an insulation layer formed thereon. The insulation layer may include an opening therethrough such that a top surface of the substrate may be exposed by the opening.

In an example embodiment, the insulation layer may have a multi-layered structure including a silicon oxide layer and a silicon nitride layer.

In an example embodiment, an impurity gas may be provided together with the silicon source.

According to an example embodiment, there is provided a method of manufacturing a semiconductor device. In the method, a plurality of sacrificial layers and a plurality of insulating interlayers are formed alternately and repeatedly on an object. A hole is formed through the sacrificial layers and the insulating interlayers. The substrate is exposed by the hole. A nitrogen containing silicon precursor is provided to form a preliminary seed layer on an inner wall of the hole. A chlorine containing silicon precursor is provided on the preliminary seed layer to form a seed layer. A silicon source is provided on the seed layer to form a polysilicon channel on the inner wall of the hole. The sacrificial layers are removed to form grooves between the insulating interlayers. A gate structure is formed in each groove.

In accordance with an example embodiment, a method for forming a polysilicon layer pattern is provided. The method includes forming an insulation layer on a substrate, forming an opening in the insulation layer by removing a portion of the insulation layer, and a top surface of the substrate is exposed by the opening, and forming a polysilicon layer in the opening by providing a silicon precursor onto an object loaded in a process chamber to form a seed layer. The silicon precursor includes a nitrogen containing silicon precursor and a chlorine containing silicon precursor.

In addition, the method further includes providing a silicon source on the seed layer to form a polysilicon layer and planarizing an upper portion of the polysilicon layer to form a polysilicon layer pattern in the opening.

According to example embodiments, a silicon precursor for forming a polysilicon layer may be seeded on an object. The silicon precursor may include a nitrogen containing silicon precursor and a chlorine containing silicon precursor. The nitrogen containing silicon precursor may be adsorbed on the object in advance to increase a density of silicon atoms, and then the chlorine containing silicon precursor may be located in remaining adsorbing sites of the object to prevent a surface diffusion of the silicon precursor. Accordingly, a seed layer of a single atomic level or a diatomic level may be obtained. A silicon source may be introduced onto the seed layer to form a polysilicon layer having a uniform thickness.

BRIEF DESCRIPTION OF THE DRAWINGS

Example embodiments can be understood in more detail from the following detailed description taken in conjunction with the accompanying drawings. FIGS. 1 to 34 represent non-limiting, example embodiments as described herein.

FIG. 1 is a flow chart illustrating a method of forming a polysilicon layer in accordance with an example embodiment;

FIGS. 2 to 7 are cross-sectional views illustrating a method of forming a polysilicon layer in accordance with an example embodiment;

FIGS. 8 to 11 are cross-sectional views illustrating a method of forming a polysilicon layer pattern in accordance with an example embodiment;

FIGS. 12 to 14 are cross-sectional views illustrating a method of forming a polysilicon layer pattern in accordance with an example embodiment;

FIGS. 15 to 23 are cross-sectional views illustrating a method of manufacturing a semiconductor device in accordance with an example embodiment;

FIGS. 24 to 30 are perspective views illustrating a method of manufacturing a semiconductor device in accordance with an example embodiment; and FIGS. 31 to 34 are cross-sectional views illustrating a method of manufacturing a semiconductor device in accordance with an example embodiment.

DETAILED DESCRIPTION OF EXAMPLE EMBODIMENTS

Various example embodiments will be described more fully hereinafter with reference to the accompanying drawings, in which example embodiments are shown. The present inventive concept may, however, be embodied in many different forms and should not be construed as limited to example embodiments set forth herein.

It will be understood that when an element or layer is referred to as being "on," "connected to" or "coupled to" another element or layer, it can be directly on, connected or coupled to the other element or layer or intervening elements or layers may be present. Like numerals refer to like elements throughout. As used herein, the term "and/or" includes any and all combinations of one or more of the associated listed items.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, example embodiments will be explained in detail with reference to the accompanying drawings.

Figure 1:
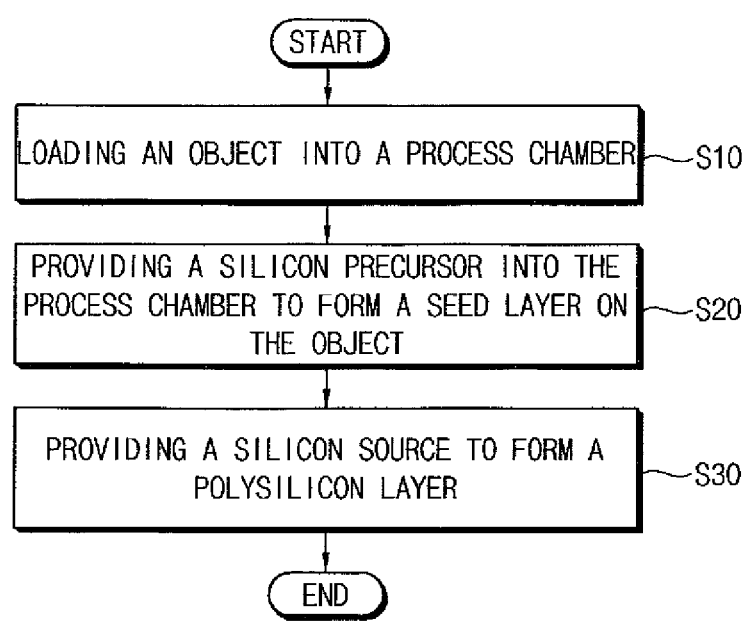

FIG. 1 is a flow chart illustrating a method of forming a polysilicon layer in accordance with an example embodiment. FIGS. 2 to 7 are cross-sectional views illustrating a method of forming a polysilicon layer in accordance with an example embodiment.

Figure 2:
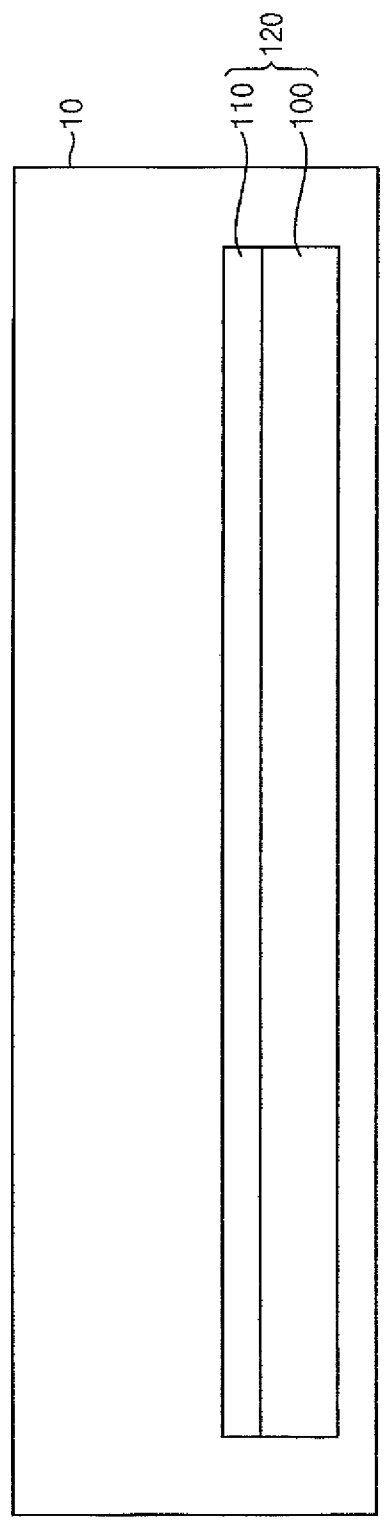

Referring to FIGS. 1 and 2, in step S10, an object 120 on which a polysilicon layer is formed may be loaded into a process chamber 10.

In an example embodiment, the process chamber 10 may be, for example, an atomic layer deposition (ALD) process chamber. The process chamber 10 may be, for example, a single type chamber or a batch type chamber.

In an example embodiment, the object 120 may include, for example, a substrate 100 and an insulation layer 110 thereon. In this case, the polysilicon layer may be formed on the insulation layer 110. The substrate 100 may include, for example, a semiconductor substrate, e.g., a silicon substrate, a germanium substrate, a silicon-germanium substrate, a silicon-on-insulator (SOI) substrate, a germanium-on-insulator (GOI) substrate, or the like. The insulation layer 110 may be formed using, e.g., silicon oxide or silicon nitride. The insulation layer 110 may be obtained by, for example, a chemical vapor deposition (CVD) process, a plasma enhanced chemical vapor deposition (PECVD) process, a spin coating process, or the like. In a case that the insulation layer 110 includes silicon oxide, the insulation layer 110 may be formed by performing, for example, a thermal oxidation process on the substrate.

Referring now to FIG. 1, in step S20, a silicon precursor may be introduced into the process chamber 10 to form a seed layer on the object 120. In an example embodiment, the silicon precursor may include, for example, a nitrogen containing silicon precursor and a chlorine containing silicon precursor. The nitrogen containing silicon precursor and the chlorine containing silicon precursor may be sequentially or simultaneously introduced into the process chamber 10.

In an example embodiment, the nitrogen containing silicon precursor may include, for example, Bis(ethylmethylamino)silane (BEMAS), Bis(diethylamino)silane (BDEAS), Bis(dimethylamino)silane (BDMAS), tris(dimethylamino)silane (Tris-DMAS), tetrakis(dimethylamino)silane (TDMAS), tris(ethylmethylamino)silane (Tris-EMAS), Diethylamino silane (DEAS), Bis(tertybutylamino)silane (BTBAS), Di-Isopropyl-Amino-Silane (DIPAS), or the like. These may be used alone or in a mixture thereof.

In an example embodiment, the chlorine containing silicon precursor may include, for example, dichlorosilane ($SiCl_2H_2$), trichlorosilane ($SiCl_3H$), tetrachlorosilane ($SiCl_4$), hexachlorodisilane ($Si_2Cl_6$), or the like. These may be used alone or in a mixture thereof.

Hereinafter, step S20 is illustrated in more detail with reference to FIGS. 3 to 7.

Figure 3:
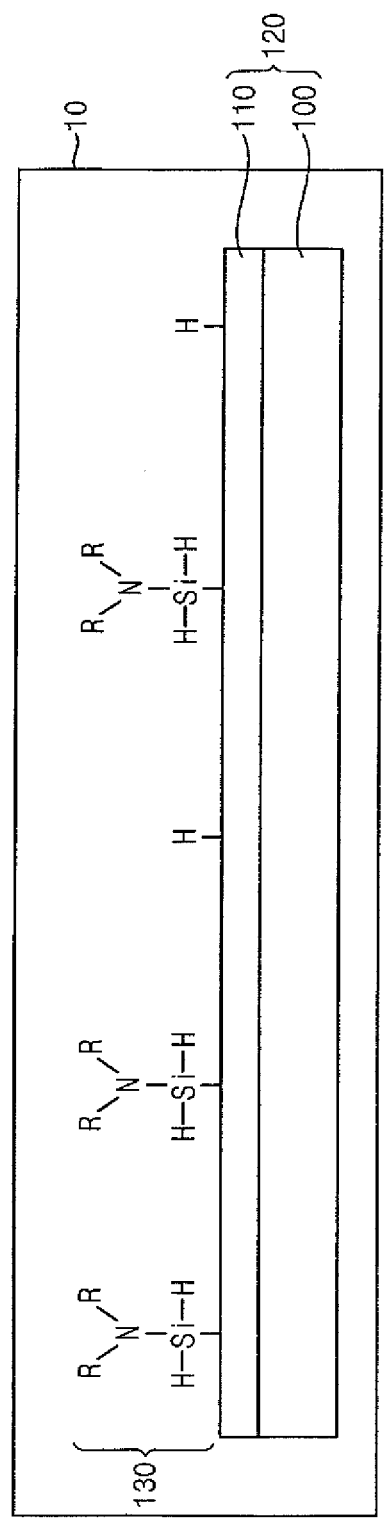

Referring to FIG. 3, the nitrogen containing silicon precursor, e.g., DIPAS may be introduced into the process chamber 10 to be adsorbed on the object 120. Accordingly, a preliminary seed layer 130 may be formed on the object 120. For a convenience of description, the preliminary seed layer 130 is represented by some of the nitrogen containing silicon precursors adsorbed on the object 120 in FIG. 3.

In an example embodiment, a silicon atom of the nitrogen containing silicon precursor may be adsorbed on the object 120, and an amino group bonded to the silicon atom may be exposed from the object 120. The amino group may include, for example, a group having at least one alkyl group bonded to a nitrogen atom. For example, the alkyl group may be an isopropyl group ($-CH(CH_3)_2$) in the case that DIPAS is used as the nitrogen containing silicon precursor.

The nitrogen containing silicon precursor may have an adsorption preference for a specific adsorption site exposed from a top surface of the object 120. For example, the adsorption site may include a hydroxyl adsorption site (—OH) or a hydrogen adsorption site (—H). For example, in an example embodiment, the nitrogen containing silicon precursor may have the adsorption preference for the hydroxyl adsorption site. Thus, the hydrogen adsorption sites may at least partially remain on the top surface of the object 120.

Figure 4:
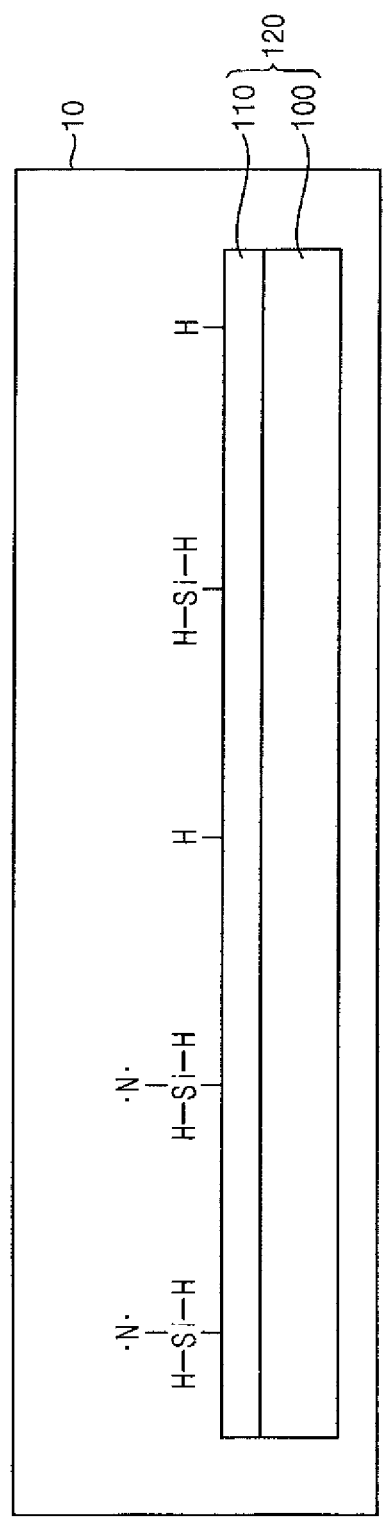

For example, referring to FIG. 4, a first purge process and/or a heat treatment may be performed after forming the preliminary seed layer 130. Accordingly, the alkyl group of the adsorbed nitrogen containing silicon precursor may be detached or separated from the nitrogen group so that the nitrogen atom may be activated. For example, the nitrogen atom may be radicalized. Alternatively, the amino group may be detached or separated from the silicon atom so that the silicon atom may be activated. In an example embodiment, the process chamber 10 may be, for example, heated to a temperature of about 400° C. to about 600° C. by the heat treatment.

Referring to FIG. 5, the chlorine containing silicon precursor may be introduced onto the preliminary seed layer 130.

For example, in an example embodiment, dichlorosilane (DCS) may be used as the chlorine containing silicon precursor. DCS may be combined with the activated nitrogen atom of the pre-adsorbed nitrogen containing silicon precursor. Further, DCS may be adsorbed on the object 120 by the remaining adsorption sites, e.g., the hydrogen adsorption sites. Therefore, the adsorption sites existing on the top surface of the object 120 may be entirely and uniformly combined with the silicon precursors without vacancies.

When a polysilicon layer is formed by a conventional ALD process, silicon sources or silicon atoms adsorbed on an object may be migrated or transferred by a surface diffusion. Thus, the silicon sources or the silicon atoms may be aggregated to result in a nucleation or a crystallization of the silicon atoms. In this case, a uniform polysilicon layer of an atomic layer level may not be easily obtained.

According to an example embodiment, the chlorine containing silicon precursor may be combined with the pre-adsorbed nitrogen containing silicon precursor to form, for example, a —Si—N—Si—Cl combination or a —Si—Si—Cl combination. Thus, the nucleation or the crystallization of the silicon atoms by the surface diffusion may be prevented during a deposition process.

As mentioned above, the nitrogen containing silicon precursor and the chlorine containing precursor may be sequentially or simultaneously introduced into the process chamber 10.

Referring to FIG. 6A, a second purge process may be performed to form a seed layer 140 of a single atomic level with a uniform thickness. A portion of the silicon precursors that may not be adsorbed on the object 120 to drift in the process chamber 10 may be removed. Additionally, bulky groups that may be attached to the silicon atoms adsorbed on the object 120, e.g., —N—Si—Cl or —Si—Cl groups may be removed.

Figure 6B:
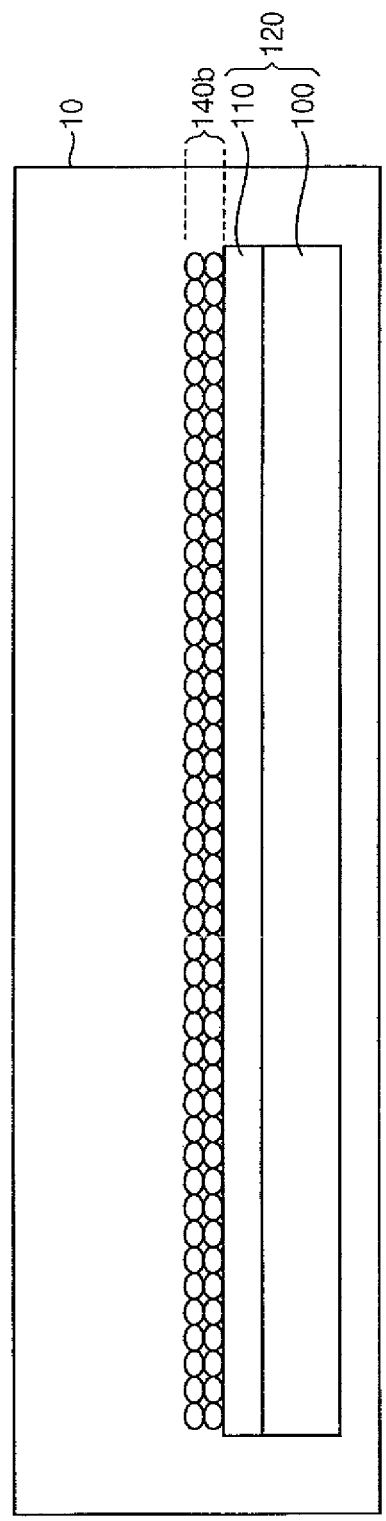

In an example embodiment, processes substantially the same as or similar to those illustrated with reference to FIGS. 3 to 6A may be repeatedly performed. In this case, a seed layer 140b having, for example, a multi-layered structure may be obtained as illustrated in FIG. 6B.

Figure 7:
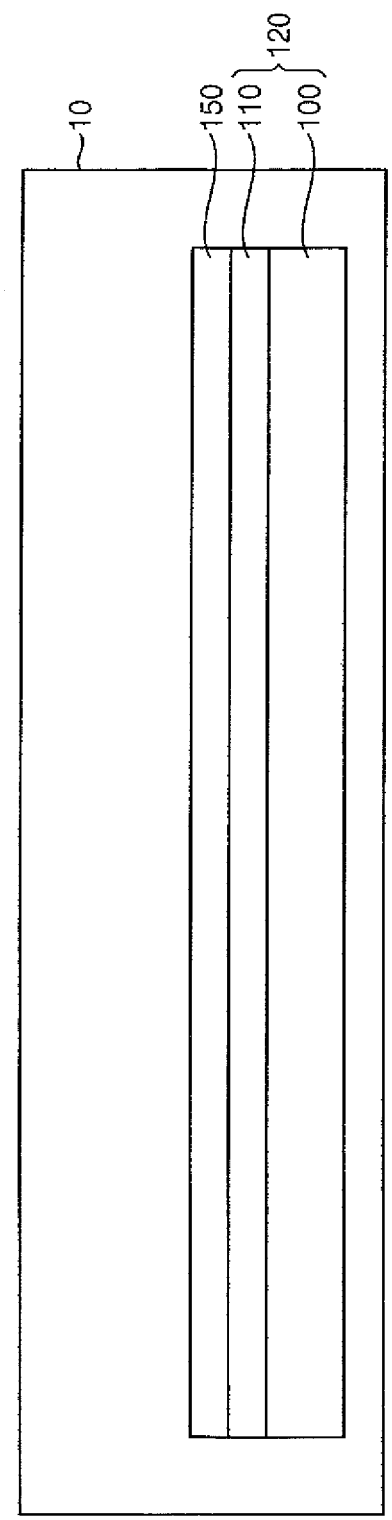

Referring to FIGS. 1 and 7, a silicon source may be provided on the seed layer 140 to form, for example, a polysilicon layer 150 (S30). In an example embodiment, the silicon source may include, for example, silane ($SiH_4$), disilane ($Si_2H_6$), trisilane ($Si_3H_8$), or the like. These may be used alone or in a mixture thereof.

For example, in an example embodiment, an impurity gas may be provided together with the silicon source. For example, the impurity gas may include $PH_3$, $B_2H_6$, $BCl_3$, $NH_3$, $AsH_3$, $BF_4$, or the like. These may be used alone or in a mixture thereof. In this case, the polysilicon layer may include, for example, doped polysilicon to have an enhanced conductivity. Further, a growth suppressing gas for preventing an irregular growth of the polysilicon layer 150 may be provided together with the silicon source. The growth suppressing gas may include, for example, $O_2$, $N_2$, $N_2O$, or the like.

Step S20 and step S30 may be, for example, an in-situ process performed in the same process chamber 10 or an ex-situ process performed in the different process chambers 10.

FIGS. 8 to 11 are cross-sectional views illustrating a method of forming a polysilicon layer pattern in accordance with an example embodiment.

Figure 8:
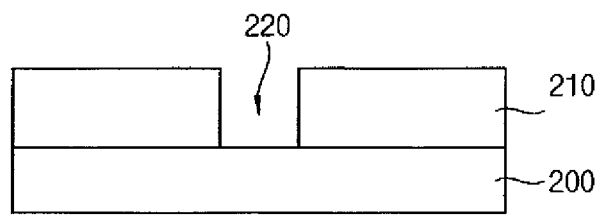

Referring to FIG. 8, a first insulation layer 210 may be formed on a substrate 200, and the first insulation layer 210 may be, for example, partially removed to form an opening 220 therein.

The substrate 200 may include, for example, a semiconductor substrate, e.g., a silicon substrate, a germanium substrate, a silicon-germanium substrate, an SOI substrate, a GOI substrate, or the like. The first insulation layer 210 may be formed using, e.g., silicon oxide, silicon nitride or silicon oxynitride. The first insulation layer 210 may be obtained by, for example, a CVD process, a PECVD process, a spin coating process, or the like. The opening 220 may be formed by, for example, a photolithography process using a photoresist pattern.

In an example embodiment, the opening 220 may have, for example, a substantial hole shape or a substantial trench shape extending linearly. A top surface of the substrate 200 may be exposed by the opening 220.

Figure 9:
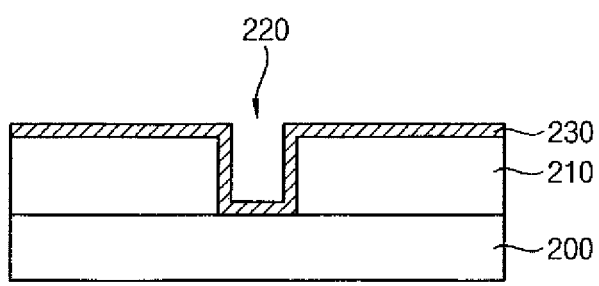

For example, referring to FIG. 9, a polysilicon layer 230 may be formed on an inner wall of the opening 220, a top surface of the first insulation layer 210 and the exposed top surface of the substrate 200. In an example embodiment, the polysilicon layer 230 may be formed by, for example, processes substantially the same as or similar to those illustrated with reference to FIGS. 1 to 7. Accordingly, the polysilicon layer 230 may have, for example, a uniform thickness throughout the inner wall of the opening 220 and the exposed top surface of the substrate 200.

Figure 10:
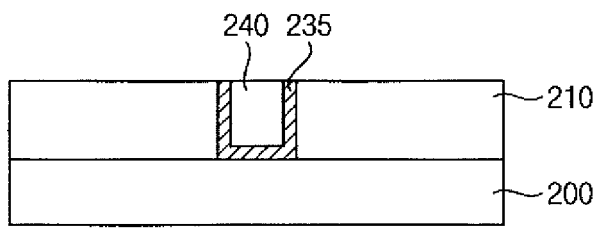

Referring to FIG. 10, an upper portion of the polysilicon layer 230 may be, for example, planarized by a chemical mechanical polishing (CMP) process or an etch-back process to form a polysilicon layer pattern 235 on the inner wall of the opening 220 and the exposed top surface of the substrate 200. In a case that the opening 220 has a substantial hole shape, the polysilicon layer pattern 235 may have, for example, a substantially hollow cylindrical shape or a substantial cup shape.

A filling layer pattern 240 may be formed on the polysilicon layer pattern 235 to fill a remaining portion of the opening 220. For example, a filling layer may be formed on the first insulation layer 210 and the polysilicon layer pattern 235 to sufficiently fill the opening 220, and then an upper portion of the filling layer may be planarized by, e.g., a CMP process or an etch-back process to obtain the filling layer pattern 240. The filling layer may be formed using, e.g., silicon oxide, silicon nitride or silicon oxynitride.

Figure 11:
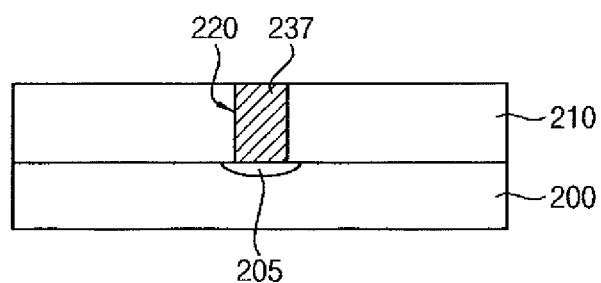

Alternatively, a polysilicon layer pattern 237 may, for example, completely fill the opening 220 as illustrated in FIG. 11. For example, a process time for providing the silicon source in step S30 (refer to FIGS. 1 and 7) may be increased until a polysilicon layer sufficiently fills the opening 220. An upper portion of the polysilicon layer may, for example, be planarized by a CMP process or an etch-back process to obtain the polysilicon layer pattern 237. As described above, the polysilicon layer may be grown by, for example, an introduction of the silicon source after a formation of the seed layer having a uniform thickness. Thus, the polysilicon layer pattern 237 without defects such as voids or seams therein may be obtained.

When the opening 220 has a substantial hole shape, the polysilicon layer pattern 237 may have, for example, a substantially solid cylindrical shape or a substantially pillar shape. In this case, the polysilicon layer pattern 237 may serve as a conductive contact pattern of various semiconductor devices. The above-mentioned impurity gas may be provided together with the silicon source so that the polysilicon layer pattern 237 may have a predetermined conductivity. As illustrated in FIG. 11, the polysilicon layer pattern 237 may, for example, make contact with a conductive region 205, e.g., an impurity region that may be formed at an upper portion of the substrate 200.

Figure 12:
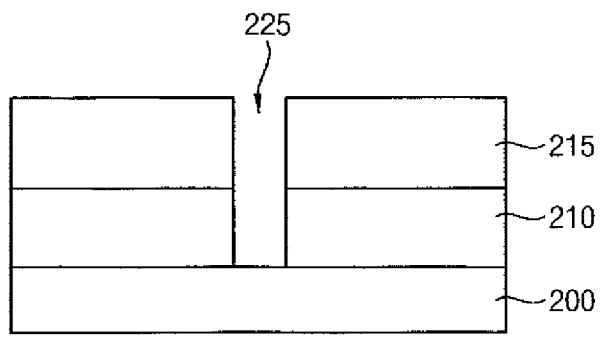
Figure 13:
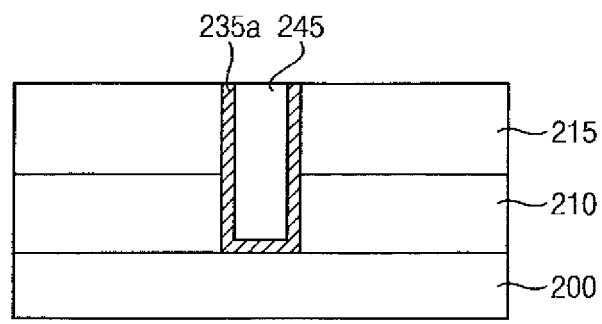
Figure 14:
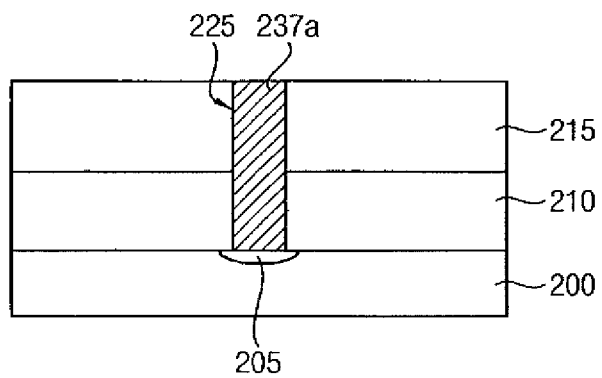

FIGS. 12 to 14 are cross-sectional views illustrating a method of forming a polysilicon layer pattern in accordance with an example embodiment. Detailed descriptions about processes substantially the same as or similar to those illustrated with reference to FIGS. 8 to 11 are omitted.

Referring to FIG. 12, a first insulation layer 210 and a second insulation layer 215 including different materials from each other may be sequentially formed on a substrate 200. The first and second insulation layers 210 and 215 may, for example, be partially removed to form an opening 225.

For example, the first insulation layer 210 may be formed using silicon oxide, and the second insulation layer 215 may be formed using silicon nitride. Alternatively, the first insulation layer 210 and the second insulation layer 215 may be formed using, for example, silicon nitride or silicon oxide, respectively. However, the number of the insulation layers is not particularly limited. A plurality of the insulation layers including different materials may be sequentially or alternately formed on the substrate 200.

The opening 225 may have, for example, a substantial hole shape or a substantial trench shape extending linearly.

Referring to FIG. 13, processes substantially the same as or similar to those illustrated with reference to FIGS. 9 and 10 may be performed. Accordingly, a polysilicon layer pattern 235*a* may be formed on an inner wall of the opening 225 and on a top surface of the substrate 200. A filling layer pattern 245 may be formed on the polysilicon layer pattern 235*a* to fill a remaining portion of the opening 225.

When a polysilicon layer is formed on a stacked structure including different insulation layers by an ALD process using silicon source such as silane, a deviation in an aspect of an adsorption degree of the silicon source may be caused according to kinds or types of the insulation layers. When the opening 225 has a high aspect ratio, a thickness deviation of the polysilicon layer becomes larger from top and bottom portions of the opening 225.

According to an example embodiment, the above-mentioned nitrogen containing silicon precursor and the chlorine containing silicon precursor may be used as the silicon precursor to form a seed layer on an object. The two different silicon precursors may be adsorbed on the object in a cooperative or complementary manner to form the seed layer. Therefore, a polysilicon layer having a uniform profile may be obtained even though the object includes different insulation layers. Further, the polysilicon layer may have a uniform thickness through top and bottom portions of an opening having a high aspect ratio.

Referring to FIG. 14, a polysilicon layer pattern 237*a* may completely fill the opening 225 as illustrated with reference to FIG. 11. In an example embodiment, the polysilicon layer pattern 237*a* may, for example, make contact with a conductive region 205 formed at an upper portion of the substrate 200 to serve as a conductive contact pattern of various semiconductor devices.

FIGS. 15 to 23 are cross-sectional views illustrating a method of manufacturing a semiconductor device in accordance with an example embodiment. For example, FIGS. 15 to 23 illustrate a method of manufacturing a vertical memory device.

Figure 15:
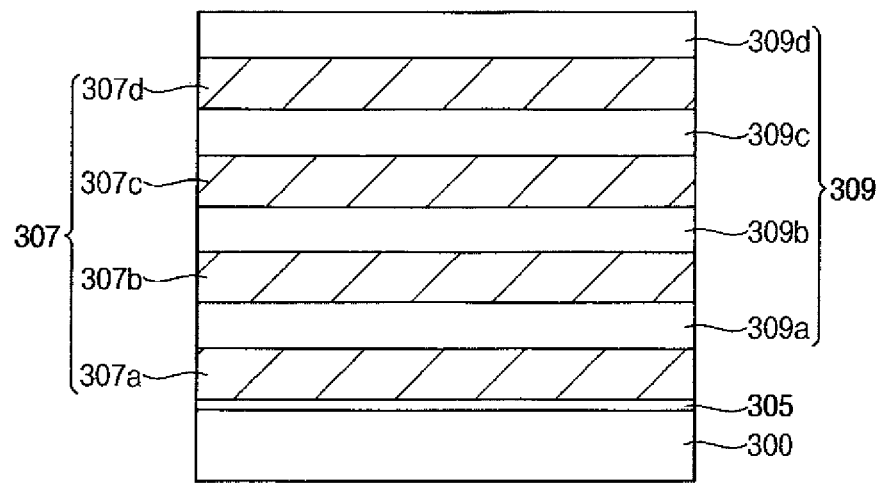

Referring to FIG. 15, a pad insulation layer 305 may be formed on a substrate 300. Sacrificial layers 307 and insulating interlayers 309 may be alternately and repeatedly formed on the pad insulation layer 305. For example, a first sacrificial layer 307*a* may be formed on the pad insulation layer 305, and then a first insulating interlayer 309*a* may be formed on the first sacrificial layer 307*a*. Similarly, second through fourth sacrificial layers 307*b*, 307*c* and 307*d*, and second through fourth insulating interlayers 309*b*, 309*c* and 309*d* may be alternately formed.

The pad insulation layer 305 may reduce stress that may be generated when the first sacrificial layer 307*a* is formed directly on the substrate 300. The pad insulation layer 305 may be formed by performing, for example, a thermal oxidation process on the substrate 300.

The sacrificial layers 307 may be removed by a subsequent process to define regions in which gate structures are formed according to levels of the vertical memory device. The sacrificial layers 307 may be formed using, for example, a material that may have an etching selectivity relative to the insulating interlayers 309. Additionally, the sacrificial layers 307 may also have, for example, an etching selectivity relative to a semiconductor pattern 315 (see FIG. 17) including polysilicon. In an example embodiment, the sacrificial layers 307 and the insulating interlayers 309 may be formed using, for example, silicon nitride and silicon oxide, respectively. The sacrificial layers 307 and the insulating interlayers 309 may be obtained by, for example, a CVD process, a PECVD process, a spin coating process, an HDP-CVD process, or the like.

A transistor at each level may be formed in a space defined when the sacrificial layer 307 is removed, and thus the number of the sacrificial layers 307 may be, for example, greater than or equal to the number of the transistors of a string including cell transistors and selection transistors.

In an example embodiment, the string may include, for example, 2 cell transistors and 2 selection transistors. However, the number of the cell transistors and the selection transistors may not be limited thereto and may be properly adjusted.

Figure 16:
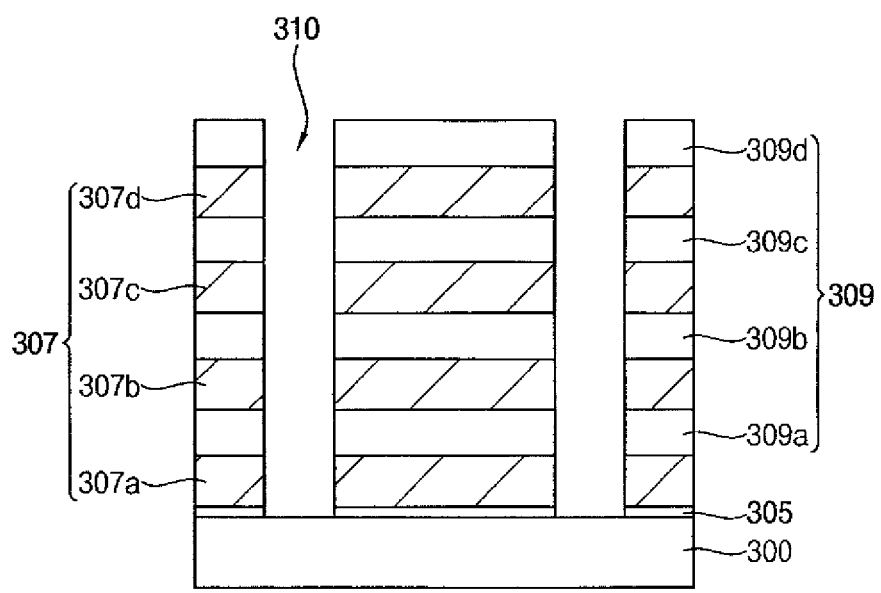

For example, referring to FIG. 16, a mask pattern (not illustrated) may be formed on the uppermost insulating interlayer 309*d*, and then the insulating interlayers 309, the sacrificial layers 307 and the pad insulation layer 305 may be sequentially etched using the mask pattern as an etching mask to form a first hole 310. The top surface of the substrate 300 may be exposed by a bottom of the first hole 310. For example, in an example embodiment, a plurality of the first holes 310 may be formed regularly in a first direction and a second direction substantially perpendicular to the first direction.

Figure 17:
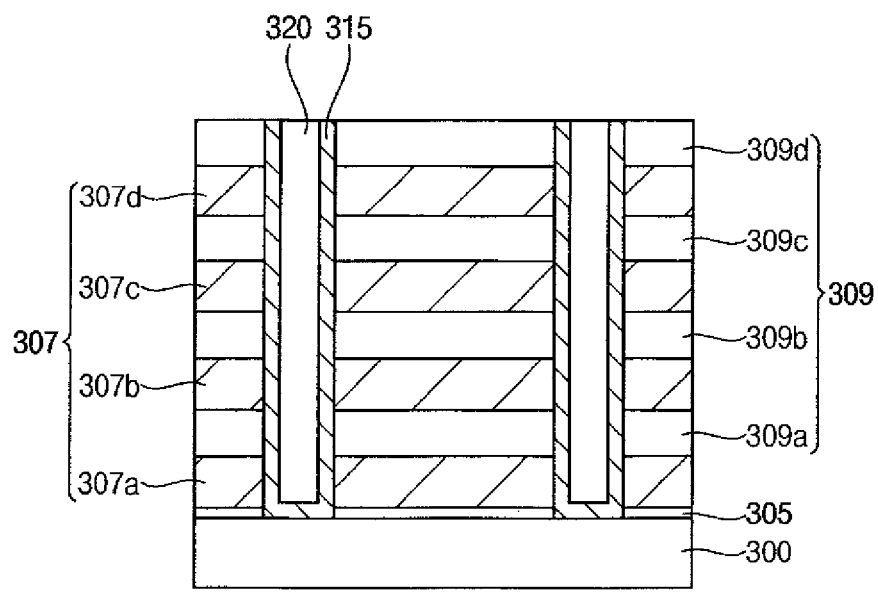

Referring to FIG. 17, a semiconductor pattern 315 may be formed on an inner wall of the first hole 310 and the substrate 300. The semiconductor pattern 315 may serve as a channel or an active region of a cell string formed vertically relative to the top surface of the substrate 300. In an example embodiment, the semiconductor pattern 315 may have, for example, a substantially hollow cylindrical shape or a substantial cup shape. The semiconductor pattern 315 may be formed using, for example, polysilicon.

An insulation layer sufficiently filling the first hole 310 may be formed on the semiconductor pattern 315 and the uppermost insulating interlayer 309d. An upper portion of the insulation layer may be, for example, planarized to form a first insulation layer pattern 320.

In an example embodiment, the semiconductor pattern 315 and the first insulation layer pattern 320 may be formed by, for example, processes substantially the same as or similar to those illustrated with reference to FIGS. 8 to 10 or FIGS. 12 to 13. In this case, the semiconductor pattern 315 and the first insulation layer pattern 320 may substantially correspond to the polysilicon layer pattern 235 or 235a and the filling layer pattern 240 or 245, respectively.

As illustrated in FIG. 16, the first hole 310 having a high aspect ratio may penetrate a multi-layered structure including the sacrificial layers 307 and the insulating interlayers 309 that may contain different materials from each other. When the polysilicon layer is formed on the inner wall of the first hole 310 by a CVD process, the polysilicon layer may not be formed to have a uniform thickness through a top portion to a bottom portion of the first hole 310. Thus, the polysilicon layer may be formed by, for example, an ALD process. As for the ALD process, silicon atoms may be migrated or transferred on the inner wall of the first hole 310 by a surface diffusion. Accordingly, the polysilicon layer obtained by the ALD process may also have, for example, a thickness deviation. However, the semiconductor pattern 315 may be formed by the above-described method according to example embodiments to have a uniform thickness through the top portion to the bottom portion of the first hole 310.

Figure 18:
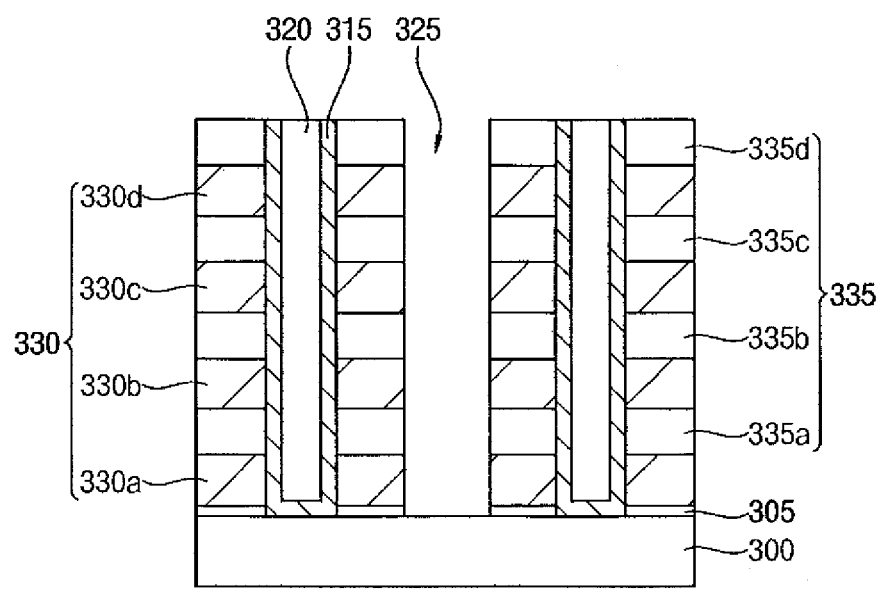

Referring to FIG. 18, the sacrificial layers 307 and the insulating interlayers 309 between the semiconductor patterns 315 may be, for example, partially removed to form an opening 325. The opening 325 may extend, for example, in the second direction. Accordingly, sacrificial layer patterns 330 and insulating insulation layer patterns 335 may be defined by the opening 325. The sacrificial layer patterns 330 and the insulating insulation layer patterns 335 may have, for example, linear shapes extending in the second direction. The sacrificial layer patterns 330 and the insulating insulation layer patterns 335 may, for example, surround an outer wall of the semiconductor pattern 315.

Figure 19:
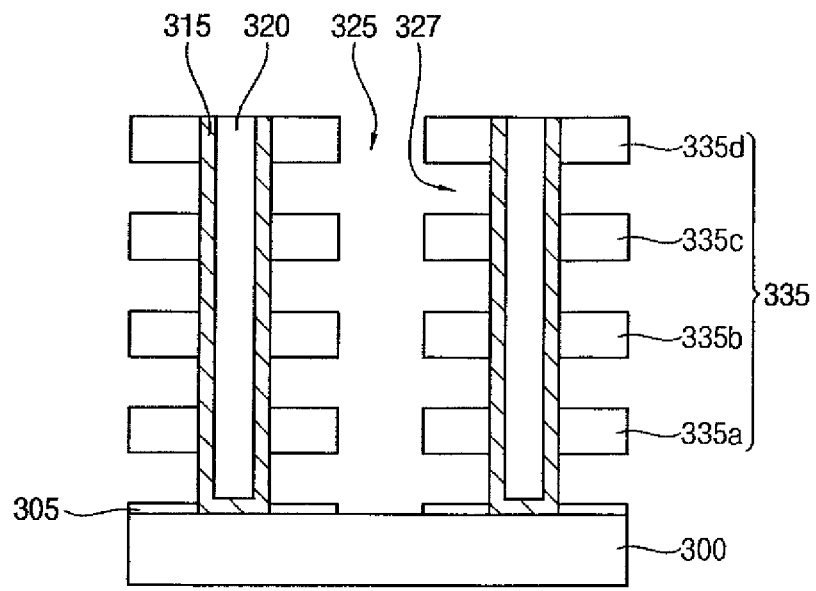

Referring to FIG. 19, the sacrificial layer patterns 330 exposed by sidewalls of the opening 325 may be removed. The sacrificial layer patterns 330 may be removed by, for example, a wet etching process. In the case that the sacrificial layer patterns 330 includes silicon nitride, the sacrificial layer patterns 330 may be removed using, for example, phosphoric acid or sulfuric acid solutions.

By removing the sacrificial layer patterns 330, the insulating interlayer patterns 335 may remain on the outer wall of the semiconductor pattern 315 to be spaced apart from each other in, for example, a vertical direction relative to the top surface of the substrate 300. Grooves 327 may be defined by spaces generated when the sacrificial layer patterns 330 are removed.

Figure 20:
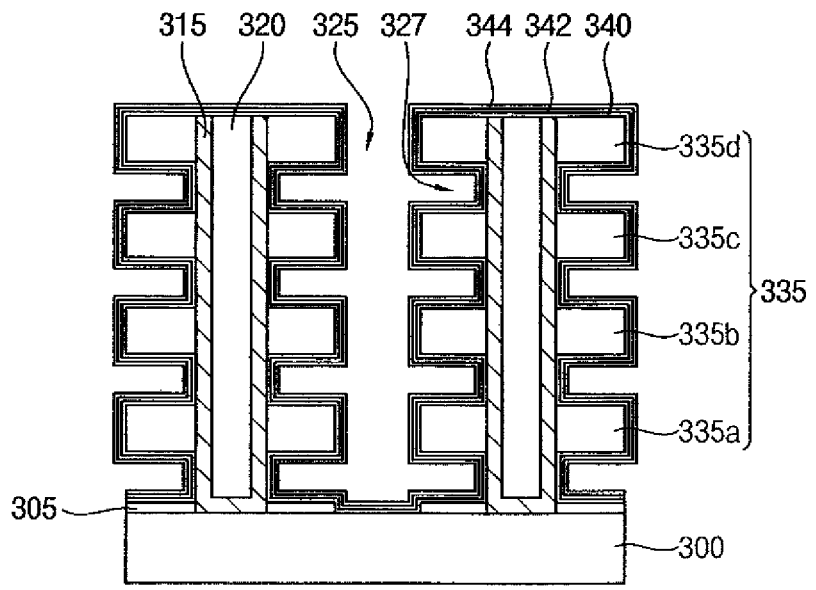

For example, referring to FIG. 20, a tunnel insulation layer 340, a charge trapping layer 342 and a blocking layer 344 may be sequentially formed along surfaces of the semiconductor pattern 315 and the insulating interlayer patterns 335.

The tunnel insulation layer 340 may be formed using, for example, silicon oxide by, e.g., a CVD process. Alternatively, the tunnel insulation layer 340 may be formed by performing, for example, a thermal oxidation process on the exposed outer wall of the semiconductor pattern 315. In this case, the tunnel insulation layer 340 may not be formed on the surface of the insulating interlayer patterns 335.

The charge trapping layer 342 may be formed using, for example, silicon nitride or a metal oxide by, e.g., a CVD process.

The blocking layer 344 may be formed on the charge trapping layer 342. The blocking layer 344 may be formed using, for example, silicon oxide or a metal oxide such as aluminum oxide, lanthanum oxide, lanthanum aluminum oxide, lanthanum hafnium oxide, hafnium aluminum oxide, titanium oxide, tantalum oxide, zirconium oxide, or the like. These may be used alone or in a mixture thereof.

In an example embodiment, the charge trapping layer 342 and the blocking layer 344 may be, for example, continuously formed throughout all levels.

Figure 21:
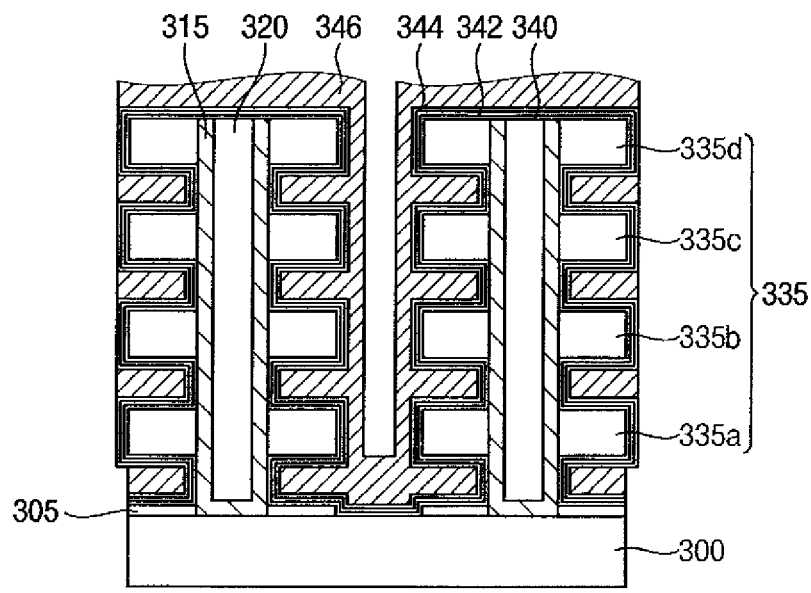

Referring to FIG. 21, a conductive layer 346 may be formed on the blocking layer 444 to sufficiently fill the grooves 327. The opening 325 may be, for example, partially filled with the conductive layer 346. The conductive layer 346 may be formed, for example, using a metal or a metal nitride having a low resistance such as, for example, tungsten, tungsten nitride, titanium, titanium nitride, tantalum, tantalum nitride or platinum. The conductive layer 346 may be obtained by, for example, a CVD process, an ALD process, a PVD process, or the like.

Figure 22:
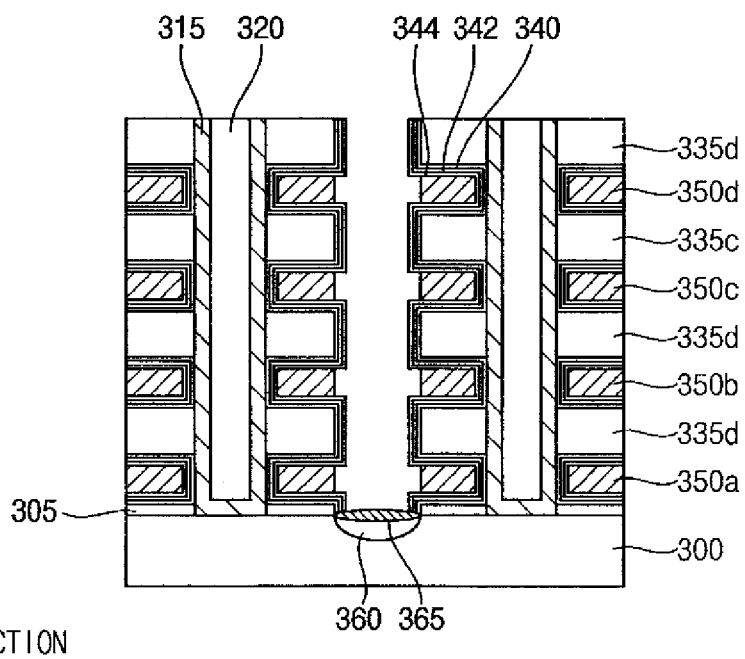

Referring to FIG. 22, the conductive layer 346 may be, for example, partially removed to form gate electrodes 350a, 350b, 350c and 350d in the grooves 327.

For example, an upper portion of the conductive layer 346 may be planarized until an uppermost insulating interlayer pattern 335d is exposed. Portions of the tunnel insulation layer 340, the charge trapping layer 342 and the blocking layer 344 formed on a top surface of the uppermost insulating interlayer pattern 335d may be also removed. A portion of the conductive layer 346 in the opening 325 may be removed by, e.g., a dry etching process to form the gate electrodes 350a, 350b, 350c and 350d. Portions of the tunnel insulation layer 340, the charge trapping layer 342 and the blocking layer 344 formed on the bottom of the opening 325 may be also removed to expose the top surface of the substrate 300.

In an example embodiment, portions of the tunnel insulation layer 340, the charge trapping layer 342 and the blocking layer 344 formed on sidewalls of the insulating interlayer patterns 335 may be, for example, also removed together with the portion of the conductive layer 346 in the opening 325. In this case, the tunnel insulation layer 340, the charge trapping layer 342 and the blocking layer 344 at different levels may be separated from each other.

By performing the above processes, a gate structure including the tunnel insulation layer 340, the charge trapping layer 342, the blocking layer 344 and the gate electrode 350 may be formed in each groove 327. In an example embodiment, the lowermost gate electrode 350a may serve as a ground selection line (GSL) and the uppermost gate electrode 350d may serve as a string selection line (SSL). The gate electrodes 350b and 350c between the GSL and the SSL may serve as word lines.

Referring now to FIG. 22, an upper portion of the substrate 300 exposed by the opening 325 may be doped with impurities, e.g., n-type impurities to form an impurity region 360. The impurity region 360 may serve as a common source line (CSL). In an example embodiment, a metal silicide pattern 365 may be further formed on the impurity region 360 to reduce resistance of the CSL.

Figure 23:
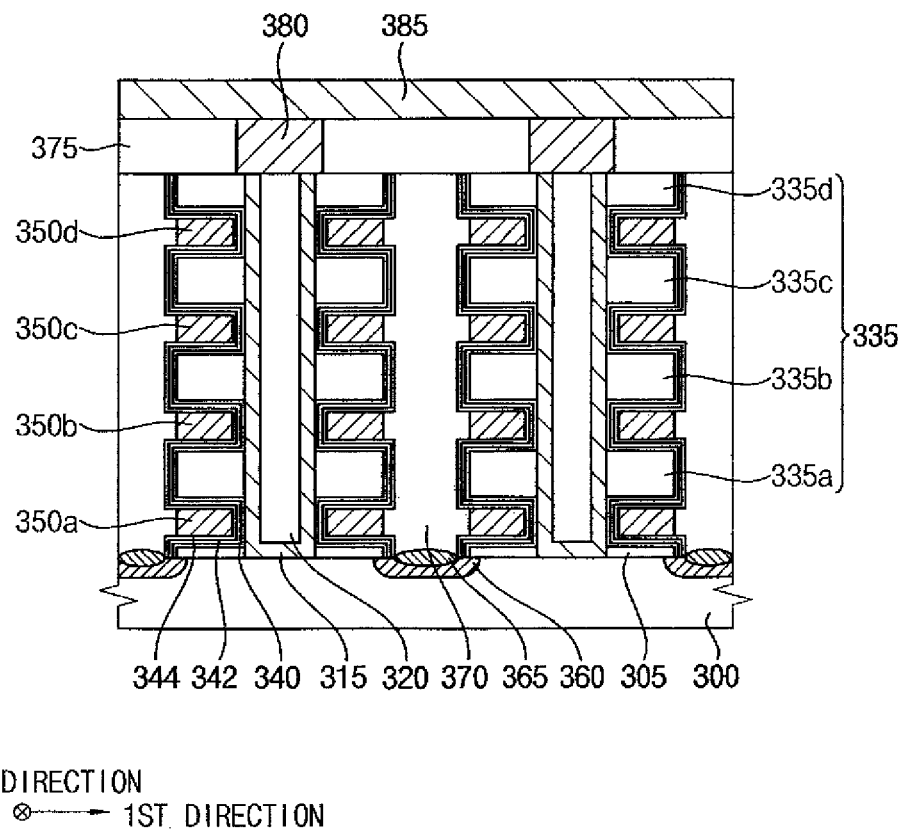

For example, referring to FIG. 23, an insulation layer may be formed to sufficiently fill the opening 325, and an upper portion of the insulation layer may be planarized to form a second insulation layer pattern 370 in the opening 325. An upper insulating interlayer 375 may be formed on the semiconductor pattern 315, the first insulation layer pattern 320, the second insulation layer pattern 370 and the uppermost insulating interlayer pattern 335d. A bit line contact 380 may be formed through the upper insulating interlayer 375 to contact the semiconductor pattern 315. A bit line 385 electrically connected to the bit line contact 380 may be formed on the upper insulating interlayer 375. The bit line 385 may have, for example, a linear shape extending in the first direction and a plurality of the bit lines 385 may be formed along the second direction. The bit line contact 380 and the bit line 385 may be formed using, for example, a metal, a metal nitride, doped polysilicon, or the like.

FIGS. 24 to 30 are perspective views illustrating a method of manufacturing a semiconductor device in accordance with an example embodiment. For example, FIGS. 24 to 30 illustrate a method of manufacturing a vertical memory device in accordance with an example embodiment. Processes, elements and/or constructions substantially the same as or similar to those illustrated with reference to FIGS. 15 to 23 are omitted.

Figure 24:
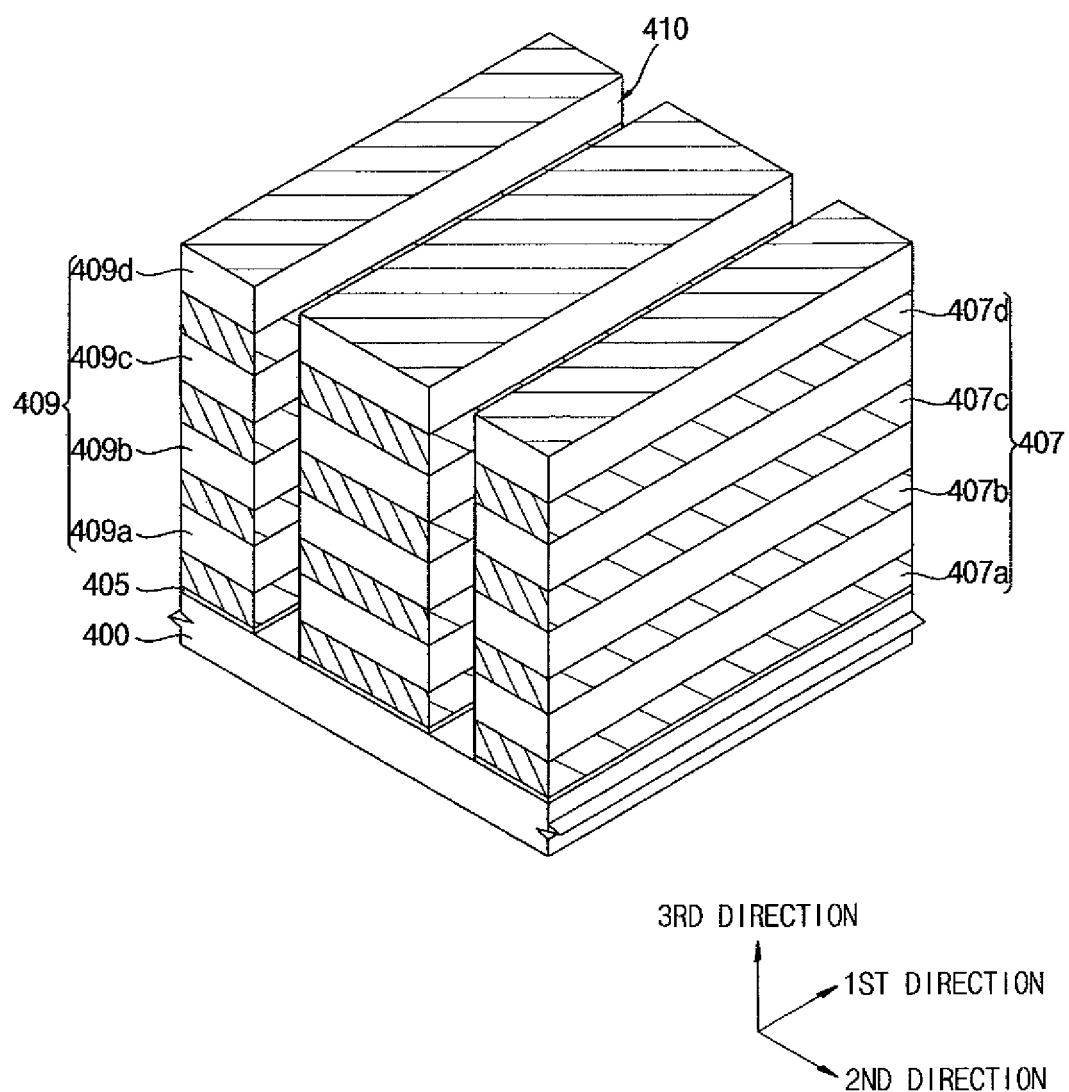

Referring to FIG. 24, using a process substantially the same as or similar to that illustrated with reference to FIG. 15, a pad insulation layer 405, sacrificial layers 407 and insulating interlayers 409 may be formed on a substrate 400 in, for example, a third direction substantially vertical to a top surface of the substrate 400.

An etching mask pattern (not illustrated) may be formed on an uppermost insulating interlayer 409d. The sacrificial layers 407, the insulating interlayers 409 and the pad insulation layer 405 may be, for example, partially removed using the etching mask to form a mold structure having a first trench 410. For example, the first trench 410 may extend in a first direction, and a plurality of the first trenches 410 may be regularly formed along a second direction that is substantially parallel to the top surface of the substrate 400 and perpendicular to the first direction.

Figure 25:
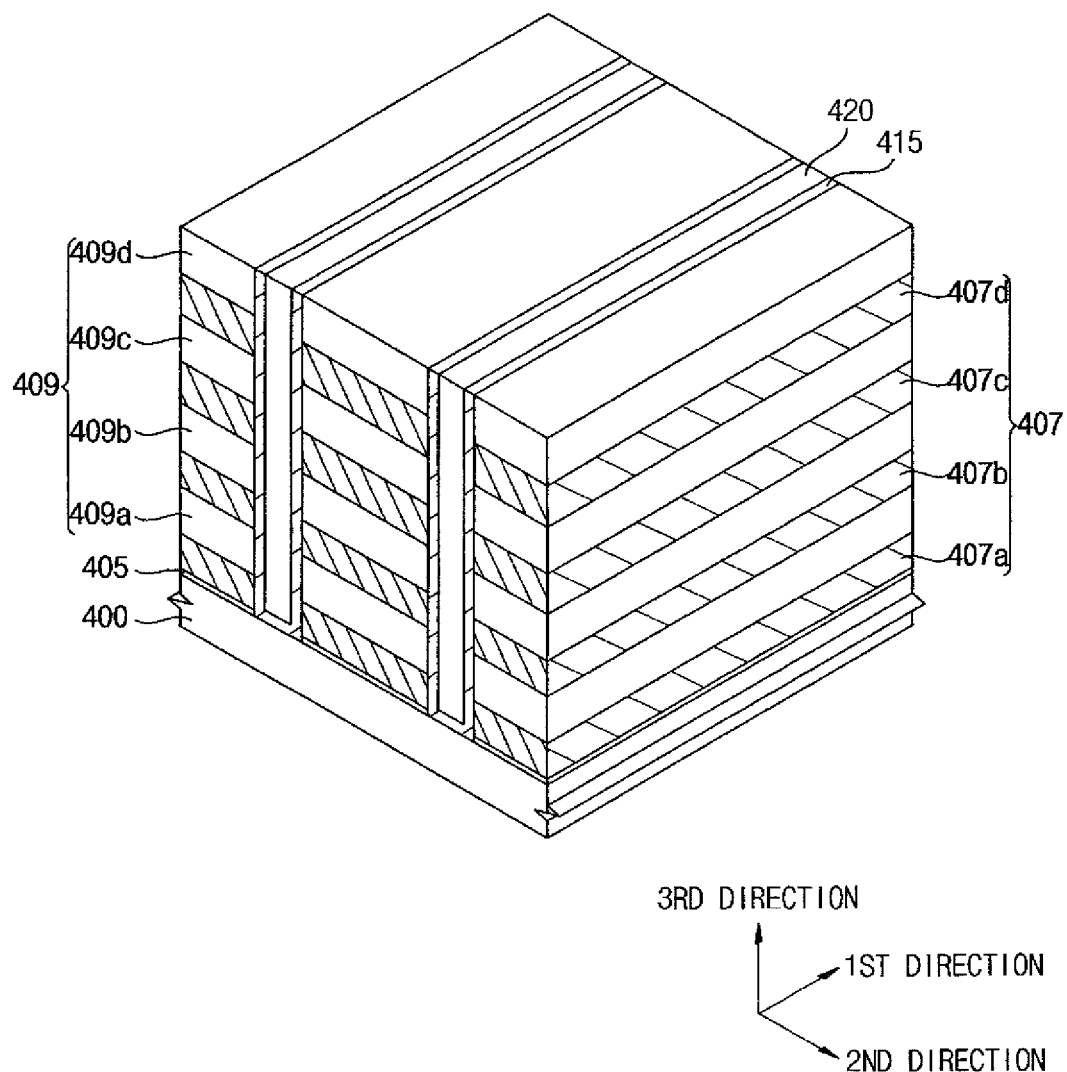

Referring to FIG. 25, processes substantially the same as or similar to those illustrated with reference to FIGS. 8 to 10 or FIGS. 12 to 13 may be performed. Accordingly, a preliminary semiconductor pattern 415 may be formed on an inner wall of the first trench 410, and a first preliminary insulation layer pattern 420 filling a remaining portion of the first trench 410 may be formed on the preliminary semiconductor pattern 415. In an example embodiment, the preliminary semiconductor pattern 415 and the first preliminary insulation layer pattern 420 may substantially correspond to the polysilicon layer pattern 235 or 235a and the filling layer pattern 240 or 245, respectively.

Figure 26:
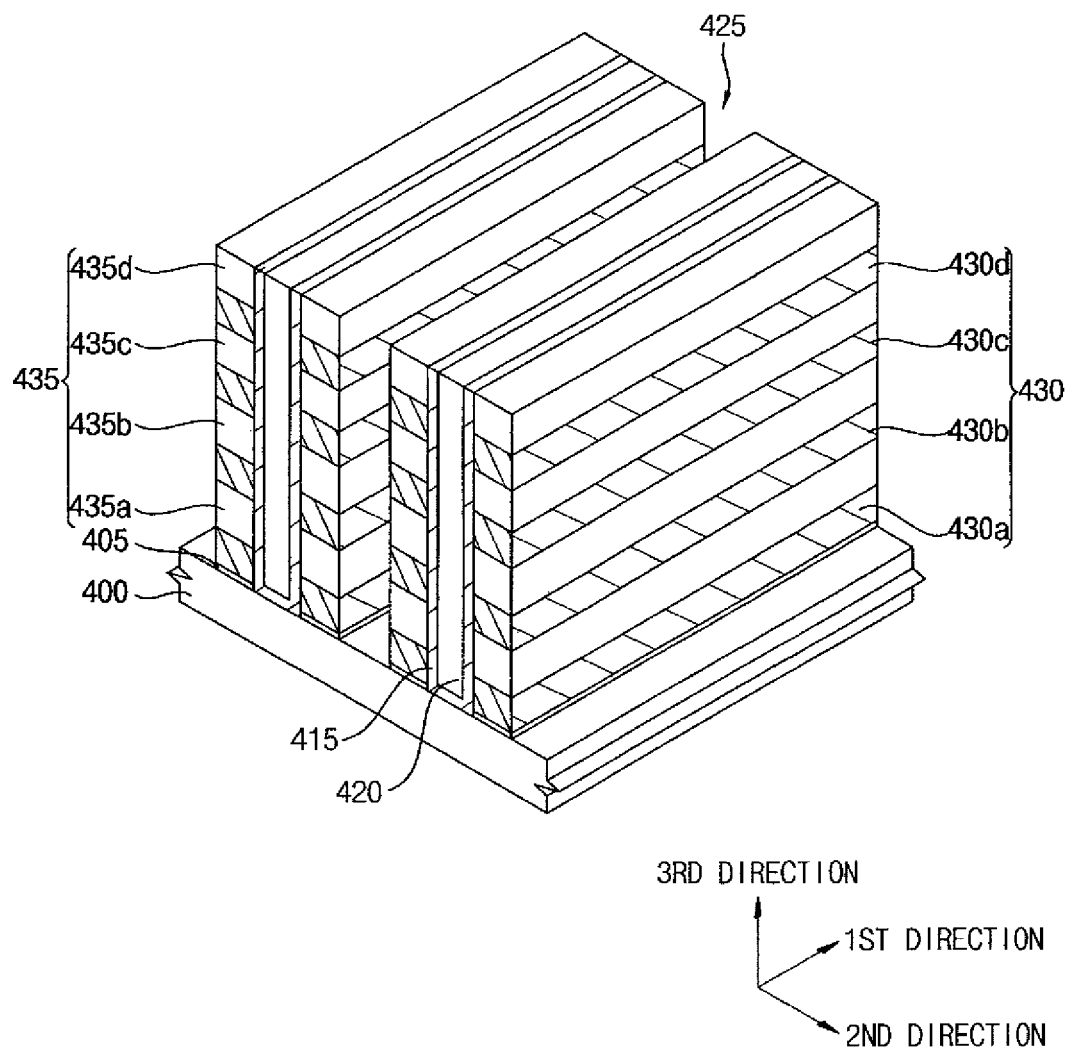

Referring to FIG. 26, the sacrificial layers 407 and the insulating interlayers 409 between the preliminary semiconductor patterns 415 may be, for example, partially etched to form a second trench 425. By forming the second trench 425, sacrificial layer patterns 430 and insulating interlayer patterns 435 extending in, for example, the first direction may be formed. The sacrificial layer patterns 430 and the insulating interlayer patterns 435 may be in contact with an outer wall of the preliminary semiconductor pattern 415.

Figure 27:
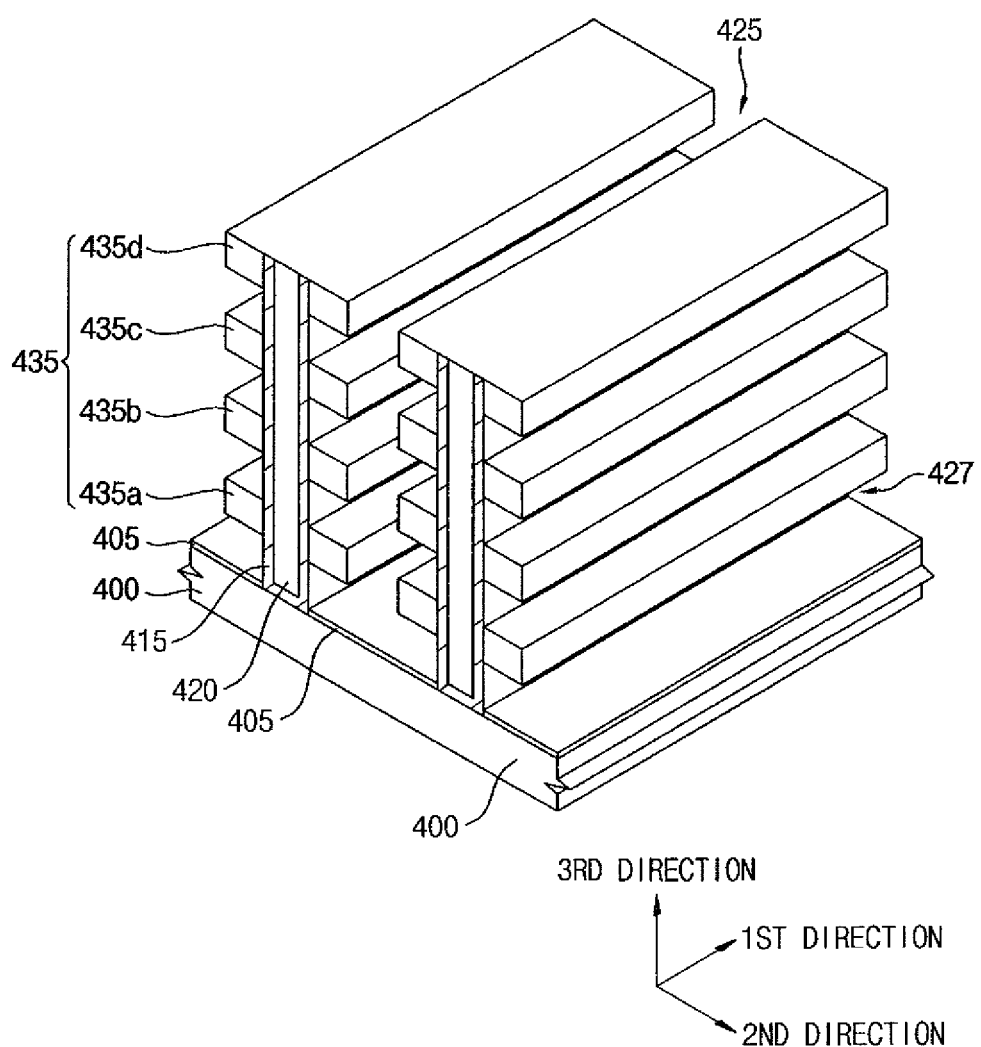

Referring to FIG. 27, a process substantially the same as or similar to that illustrated with reference to FIG. 19 may be performed. Accordingly, the sacrificial layer patterns 430 exposed by a sidewall of the second trench 425 may be removed to form a third trench 427. The third trench 427 may extend, for example, in the first direction, and a plurality of the third trenches 427 may be regularly formed along the third direction.

Figure 28:
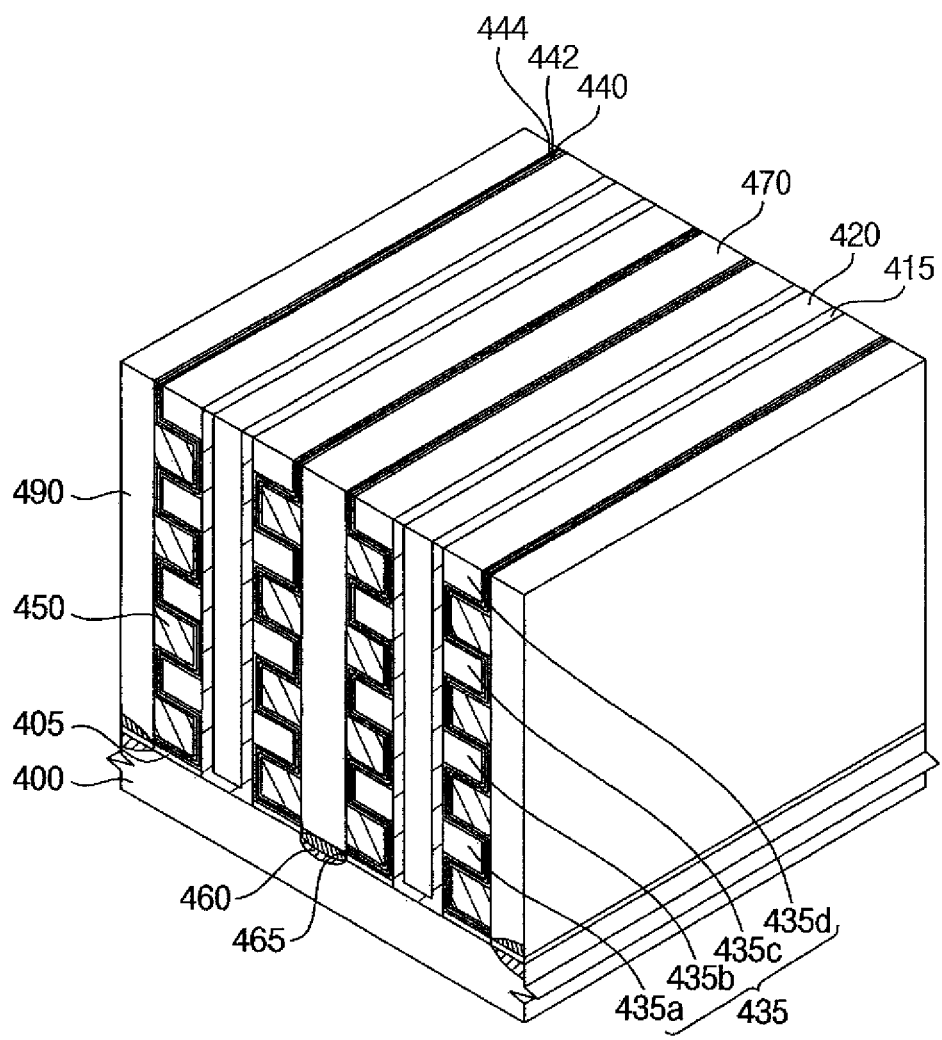

Referring to FIG. 28, processes substantially the same as or similar to those illustrated with reference to FIGS. 20 and 21 may be performed. Accordingly, a tunnel insulation layer 440, a charge trapping layer 442 and a blocking layer 444 may be formed on the exposed outer wall of the preliminary semiconductor pattern 415 and on surfaces of the insulating interlayers 435. A conductive layer sufficiently filling the third trenches 427 may be formed on the blocking layer 444.

A process substantially the same as or similar to that illustrated with reference to FIG. 22 may be performed to remove a portion of the conductive layer formed in the second trench 425. Portions of the tunnel insulation layer 440, the charge trapping layer 442 and the blocking layer 444 formed on a bottom of the second trench 425 may be also removed to expose the top surface of the substrate 400.

By performing the above-described processes, gate electrodes 450 may be formed between the insulating interlayer patterns 435 adjacent in the third direction. The gate electrode 450 at each level may have, for example, a linear shape extending in the first direction. The gate electrodes 450 at different levels may be insulated by the insulating interlayer patterns 435.

Impurities may be implanted through the top surface of the substrate 400 exposed by the bottom of the second trench 425 to form an impurity region 460 that may serve as a CSL of the vertical memory device. For example, the impurity region may include N-type impurities. In an example embodiment, a metal silicide pattern 465 may be further Ruined on the impurity region 460 to reduce a resistance of the CSL.

An insulation layer filling the second trench 425 may be formed. An upper portion of the insulation layer may be, for example, planarized to form a second insulation layer pattern 470.

Referring to FIG. 29, mask patterns (not illustrated) extending in, for example, the second direction may be formed on a structure of FIG. 28. The preliminary semiconductor pattern 415 and the first preliminary insulation layer pattern 420 may be, for example, partially etched using the mask pattern as an etching mask to form openings 472. By the above etching process, a semiconductor pattern 415a and a first insulation layer pattern 420a having, for example, substantially rectangular parallelepiped shapes may be formed.

Figure 30:
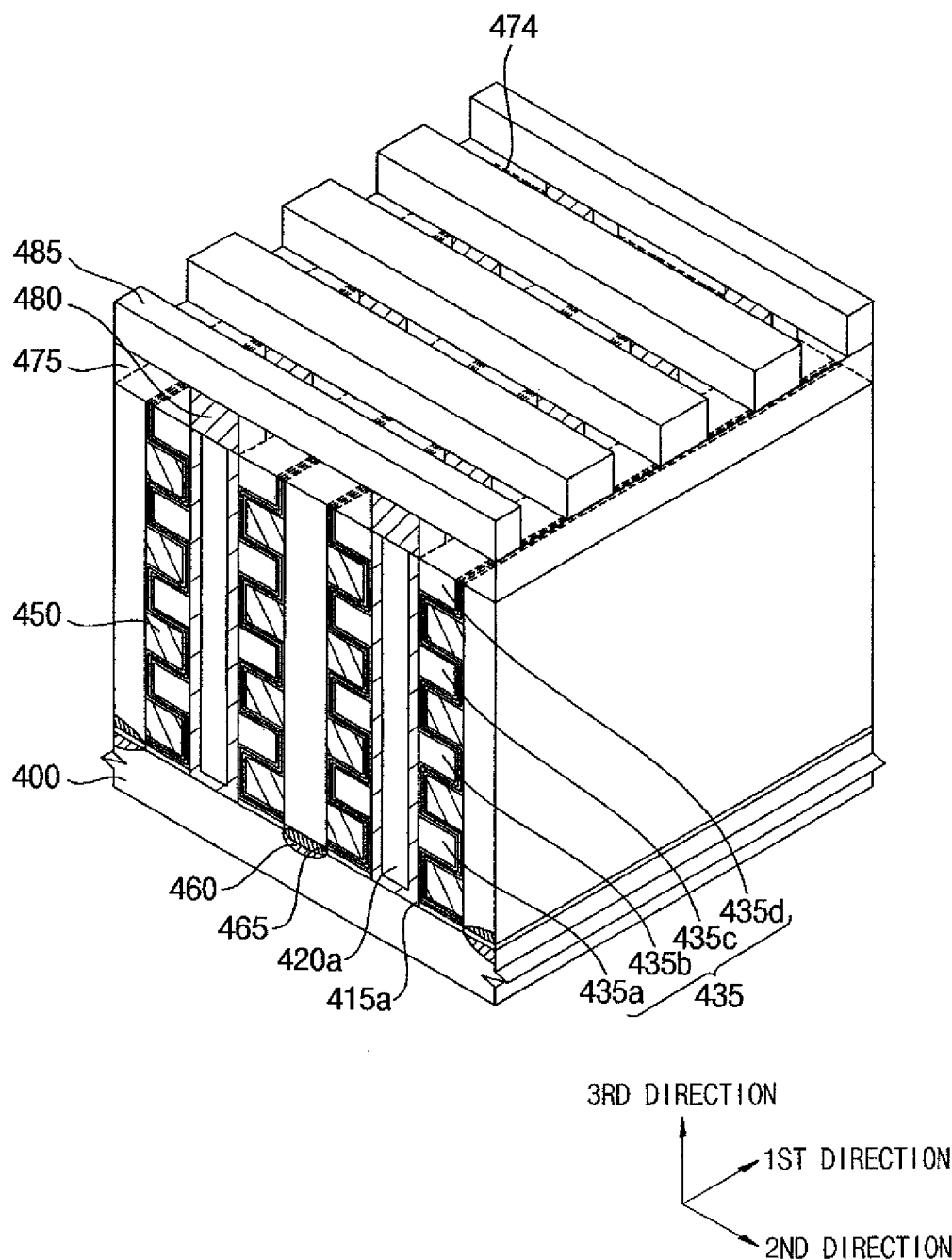

Referring to FIG. 30, a third insulating layer pattern 474 filling the opening 472 may be formed. For example, a silicon oxide layer may be deposited to sufficiently fill the openings 472. An upper portion of the silicon oxide layer may be planarized until, for example, the uppermost insulating interlayer pattern 435d is exposed to form the third insulation layer pattern 474.

An upper insulation layer 475 may be formed on the semiconductor pattern 415a, the first through the third insulation layer patterns 420a, 470 and 474 and the uppermost insulating interlayer pattern 435d. A bit line contact 480 may be formed through the upper insulation layer 475 to be in contact with the semiconductor pattern 415a. A bit line 485 electrically connected to the bit line contact 480 may be formed. The bit line 485 may have, for example, a linear shape extending in the second direction, and a plurality of the bit lines 485 may be regularly formed along the first direction. The bit line 485 may be electrically connected to the semiconductor pattern 415a.

In an example embodiment, the bit line 485 may be, for example, in direct contact with the semiconductor pattern 415a without forming the bit line contact 480.

FIGS. 31 to 34 are cross-sectional views illustrating a method of manufacturing a semiconductor device in accordance with an example embodiment. For example, FIGS. 31 to 34 illustrate a method of manufacturing a dynamic random access memory (DRAM) device in accordance with an example embodiment.

Figure 31:
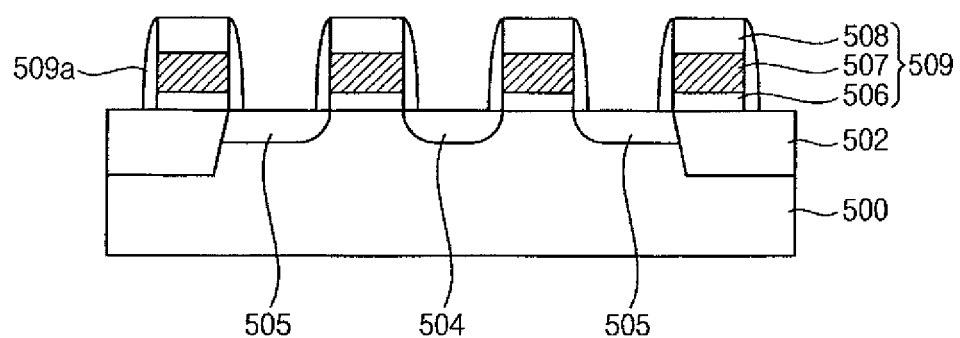

Referring to FIG. 31, an isolation layer 502 may be formed on a substrate 500. The isolation layer 502 may be formed by, for example, a shallow trench isolation (STI) process.

A gate insulation layer, a gate electrode layer and a gate mask layer may be, for example, sequentially formed on the substrate 500. The gate insulation layer, the gate electrode layer and the gate mask layer may be patterned by, e.g., a photolithography process to form a plurality of gate structures 509 on the substrate 500. Each gate structure 509 may include, for example, a gate insulation layer pattern 506, a gate electrode 507 and a gate mask 508 sequentially stacked on the substrate 500. The gate insulation layer may be formed using, for example, silicon oxide or a metal oxide. The gate electrode layer may be formed using, for example, doped polysilicon or a metal. The gate mask layer may be formed using, for example, silicon nitride.

Impurities may be implanted onto the substrate 500 using the gate structure 509 as, for example, an ion-implantation mask to form first and second impurity regions 504 and 505 at upper portions of the substrate 500 adjacent to the gate structures 509. Transistors may be defined by the gate structures 509 and the impurity regions 504 and 505. The first and second impurity regions 504 and 505 may serve as source/drain regions of the transistor.

A spacer 509a may be further formed on a sidewall of the gate structure 509. The spacer 509a may include, for example, silicon nitride.

Figure 32:
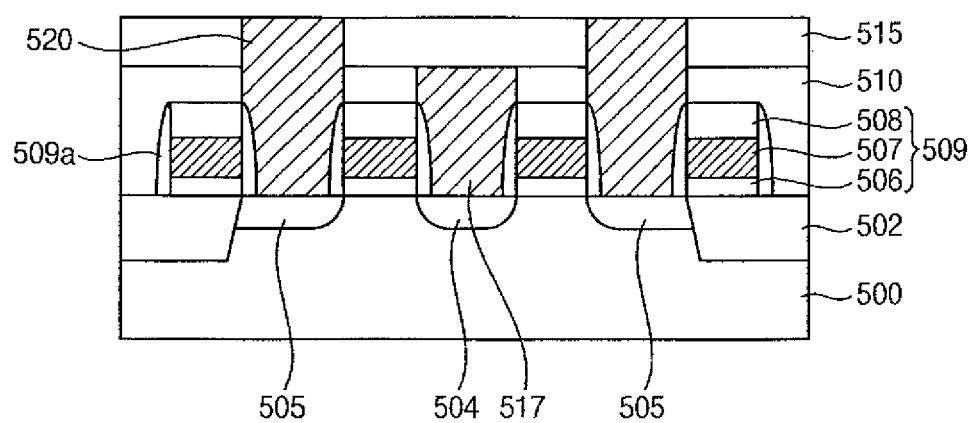

Referring to FIG. 32, a first insulating interlayer 510 covering the gate structures 509 and the spacers 509a may be formed on the substrate 500. The first insulating interlayer 510 may be, for example, partially removed to form a first hole (not illustrated) exposing the first impurity region 504. In an example embodiment, the first hole may be, for example, self-aligned with the gate structures 509 and the spacers 509a.

A first conductive layer filling the first holes may be formed on the substrate 500 and the first insulating interlayer 510. An upper portion of the first conductive layer may be planarized by, for example, a CMP process and/or an etch-back process until a top surface of the first insulating interlayer 510 is exposed to form a first plug 517 in the first hole. The first plug 517 may make contact with the first impurity region 504. The first conductive layer may be formed using, for example, doped polysilicon, a metal, or the like. The first plug 517 may serve as a bit line contact.

A second conductive layer (not illustrated) contacting the first plug 517 may be formed on the first insulating interlayer 510 and the second conductive layer may be patterned to form a bit line (not illustrated). The second conductive layer may be formed using, for example, doped polysilicon, a metal, or the like.

A second insulating interlayer 515 covering the bit line may be formed on the first insulating interlayer 510. The second insulating interlayer 515 and the first insulating interlayer 510 may be, for example, sequentially etched to form a second hole (not illustrated) exposing the second impurity region 505.

A second plug 520 filling the second hole may be formed to be in contact with the second impurity region 505. The second plug 520 may be formed using, for example, a metal or doped polysilicon. In an example embodiment, the second plug 520 may be formed by, for example, processes substantially the same as or similar to those of forming the polysilicon layer pattern 237 or 237a illustrated with reference to FIG. 11 or FIG. 14. Accordingly, the second plug 520 without defects such as voids and seams therein may be obtained.

Figure 33:
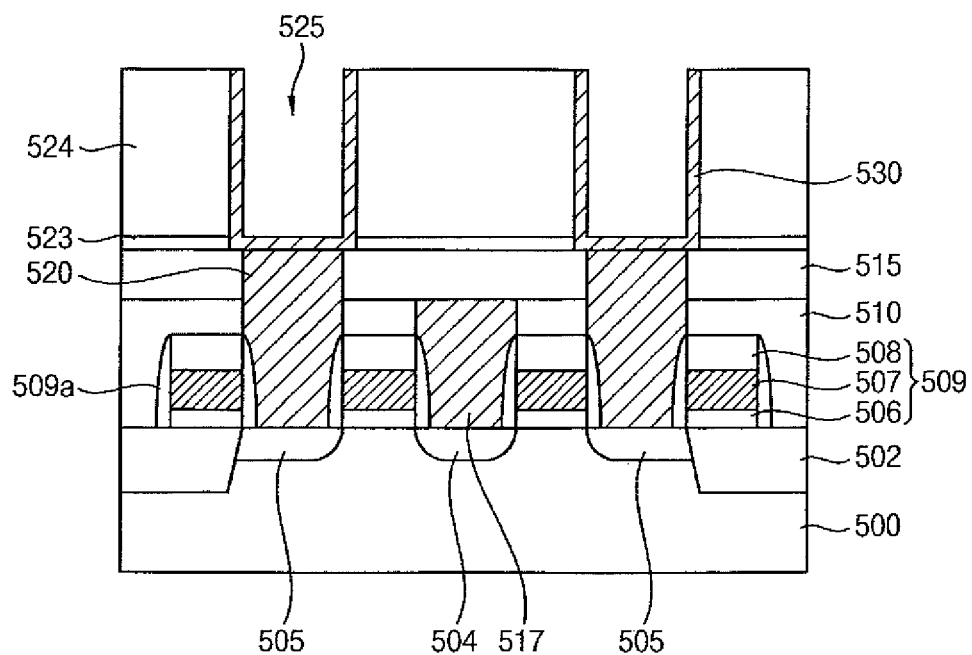

Referring to FIG. 33, an etch-stop layer 523 and a mold layer 524 may be formed on the second insulating interlayer 515. The mold layer 524 and the etch-stop layer 523 may be, for example, partially removed to form an opening 525 exposing a top surface of the second plug 520.

A lower electrode layer may be formed on a sidewall and a bottom of the opening 525 and on a top surface of the mold layer 524. The lower electrode layer may be formed using, for example, a metal or a metal nitride, e.g., titanium, titanium nitride, tantalum, tantalum nitride, tungsten nitride, ruthenium, etc., or doped polysilicon. In an example embodiment, the lower electrode layer may be formed by, for example, processes substantially the same as or similar to those of forming the polysilicon layer illustrated with reference to FIGS. 1 to 7 or FIGS. 8 to 9. The impurity gas may be, for example, provided together with the silicon source to obtain the lower electrode layer including doped polysilicon. Accordingly, the lower electrode layer may have a uniform thickness throughout top and bottom portions of the opening 525 that may have a relatively high aspect ratio.

A sacrificial layer may be formed on the lower electrode layer, and then the sacrificial layer and the lower electrode layer may be, for example, partially removed to expose the top surface of the mold layer. The sacrificial layer and the mold layer may be removed to form a lower electrode 530 electrically connected to the second plug 520.

Figure 34:
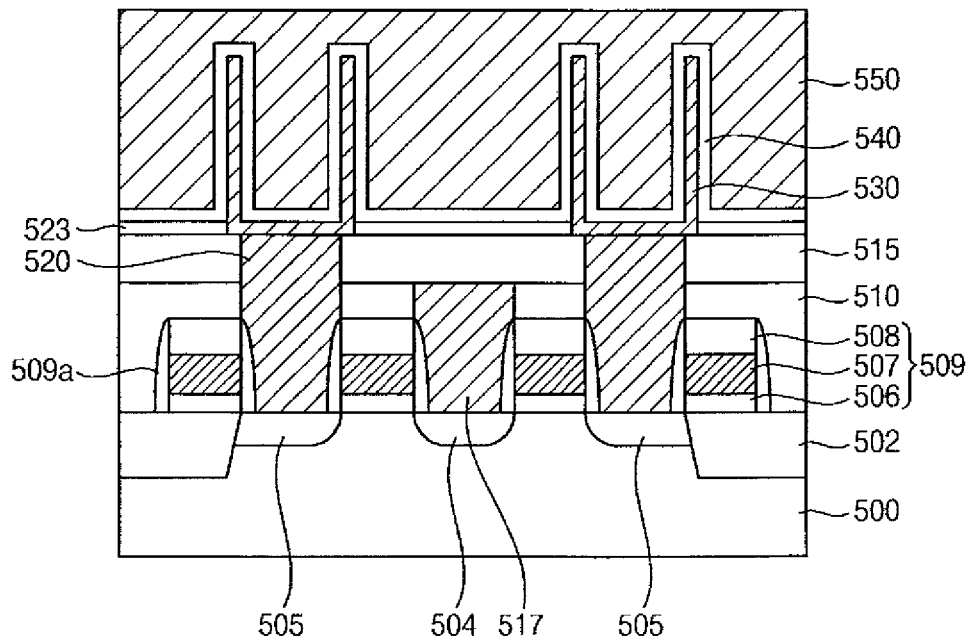

Referring to FIG. 34, a dielectric layer 540 covering the lower electrode 530 may be formed on the etch-stop layer 523. The dielectric layer 540 may be formed using, for example, a material that may have a dielectric constant greater than those of silicon oxide or silicon nitride.

The upper electrode 550 may be formed on the dielectric layer 540. The upper electrode 550 may be formed using, for example, a metal and/or a metal nitride such as titanium, titanium nitride, tantalum, tantalum nitride, tungsten nitride, ruthenium, or the like.

Accordingly, a capacitor including the lower electrode 530, the dielectric layer 540 and the upper electrode 550 may be obtained.

Having described example embodiments of the present invention, it is further noted that it is readily apparent to those of ordinary skill in the art that various modifications may be made without departing from the spirit and scope of the invention which is defined by the metes and bounds of the appended claims.

What is claimed is:

1. A method of forming a polysilicon layer, comprising:
providing a silicon precursor onto an object loaded in a process chamber to form a seed layer, wherein the silicon precursor includes a nitrogen containing silicon precursor and a chlorine containing silicon precursor, and wherein the nitrogen containing silicon precursor and the chlorine containing silicon precursor are adsorbed directly on the object; and
providing a silicon source on the seed layer.

2. The method of claim 1, wherein the nitrogen containing silicon precursor includes at least one selected from the group consisting of Bis(ethylmethylamino)silane (BEMAS), Bis(diethylamino)silane (BDEAS), Bis(dimethylamino)silane (BDMAS), tris(dimethylamino)silane (Tris-DMAS), tetrakis(dimethylamino)silane (TDMAS), tris(ethylmethylamino)silane (Tris-EMAS), Diethylaminosiliane (DEAS), Bis(tertybutylamino)silane (BTBAS) and Di-Isopropyl-Amino-Silane (DIPAS).

3. The method of claim 1, wherein the chlorine containing silicon precursor includes at least one selected from the group consisting of dichlorosilane ($SiCl_2H_2$), trichlorosilane ($SiCl_3H$), tetrachlorosilane ($SiCl_4$) and hexachlorodisilane ($Si_2Cl_6$).

4. The method of claim 1, wherein the silicon source includes at least one selected from the group consisting of silane ($SiH_4$), disilane ($Si_2H_6$) and trisilane ($Si_3H_8$).

5. The method of claim 1, wherein the process chamber includes an atomic layer deposition (ALD) process chamber.

6. The method of claim 1, wherein the providing of the silicon precursor onto the object loaded in the process chamber to form the seed layer comprises:
   providing the nitrogen containing silicon precursor onto the object loaded in the process chamber to form a preliminary seed layer; and
   providing the chlorine containing silicon precursor on the preliminary seed layer to form the seed layer.

7. The method of claim 6, further comprising: performing a first purge process and a heat treatment after forming the preliminary seed layer.

8. The method of claim 7, wherein nitrogen atoms or silicon atoms of the nitrogen containing silicon precursor are activated by the first purge process and the heat treatment.

9. The method of claim 8, further comprising: performing a second purge process after providing the chlorine containing silicon precursor, wherein —N—Si—Cl or —Si—Cl groups that are attached to silicon atoms of the seed layer are removed by the second purge process.

10. The method of claim 9, wherein the second purge process reduces the seed layer to a single atomic layer structure.

11. The method of claim 1, wherein the providing of the nitrogen containing silicon precursor and the providing of the chlorine containing silicon precursor are simultaneously performed.

12. The method of claim 6, wherein the forming of the preliminary seed layer and the forming of the seed layer are repeatedly performed.

13. The method of claim 1, wherein the object includes a substrate and an insulation layer formed thereon, and wherein the insulation layer includes an opening therethrough such that a top surface of the substrate is exposed.

14. The method of claim 13, wherein the insulation layer has a multi-layered structure including a silicon oxide layer and a silicon nitride layer.

15. The method of claim 1, wherein an impurity gas is provided together with the silicon source.

16. A method of manufacturing a semiconductor device, comprising:
   forming a plurality of sacrificial layers and a plurality of insulating interlayers alternately and repeatedly on an object;
   forming a hole through the sacrificial layers and the insulating interlayers, wherein the substrate is exposed by the hole;
   providing a nitrogen containing silicon precursor to form a preliminary seed layer on an inner wall of the hole;
   providing a chlorine containing silicon precursor on the preliminary seed layer to form a seed layer;
   providing a silicon source on the seed layer to form a polysilicon channel on the inner wall of the hole;
   removing the sacrificial layers to form grooves between the insulating interlayers; and
   forming a gate structure in each groove,
   wherein the nitrogen containing silicon precursor and the chlorine containing silicon precursor are adsorbed directly on the inner wall of the hole.

17. The method of claim 16, wherein the gate structure includes a tunnel insulation layer, a charge trapping layer, a blocking layer and a gate electrode sequentially stacked in each groove.

18. A method for forming a polysilicon layer pattern comprising:
   forming an insulation layer on a substrate;
   forming an opening in the insulation layer by removing a portion of the insulation layer, wherein a top surface of the substrate is exposed by the opening;
   forming a seed layer in the opening by providing a silicon precursor onto an object loaded in a process chamber, wherein the silicon precursor includes a nitrogen containing silicon precursor and a chlorine containing silicon precursor, and the nitrogen containing silicon precursor and the chlorine containing silicon precursor are adsorbed directly on the object;
   providing a silicon source on the seed layer to form a polysilicon layer; and
   planarizing an upper portion of the polysilicon layer to form a polysilicon layer pattern in the opening.

19. The method of claim 18, wherein the polysilicon layer pattern is formed on an inner wall of the opening and the exposed top surface of the substrate and the method further comprising: forming a filling layer pattern on the polysilicon layer pattern to fill a remaining portion of the opening.

20. The method of claim 18, wherein the polysilicon layer pattern fills substantially the entire opening and contacts with an impurity region disposed at an upper portion of the substrate.

* * * * *